United States Patent
Wada

(10) Patent No.: US 9,356,206 B2
(45) Date of Patent: May 31, 2016

(54) LIGHT EMITTING DEVICE

(71) Applicant: TOYODA GOSEI CO., LTD., Kiyosu-shi (JP)

(72) Inventor: Satoshi Wada, Kiyosu (JP)

(73) Assignee: TOYODA GOSEI CO., LTD., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/516,085

(22) Filed: Oct. 16, 2014

(65) Prior Publication Data

US 2015/0102366 A1    Apr. 16, 2015

(30) Foreign Application Priority Data

Oct. 16, 2013    (JP) ................. 2013-215150

(51) Int. Cl.
| | |
|---|---|
| *H01L 33/50* | (2010.01) |
| *H01L 25/075* | (2006.01) |
| *H01L 33/56* | (2010.01) |
| *H01L 33/60* | (2010.01) |

(52) U.S. Cl.
CPC .......... *H01L 33/505* (2013.01); *H01L 25/0753* (2013.01); *H01L 33/56* (2013.01); *H01L 33/60* (2013.01)

(58) Field of Classification Search
CPC ........................................ H01L 33/50–33/502
See application file for complete search history.

(56) References Cited

U.S. PATENT DOCUMENTS

| | | | |
|---|---|---|---|
| 2010/0320479 A1 | 12/2010 | Minato et al. | |
| 2011/0309388 A1* | 12/2011 | Ito et al. | 257/89 |

FOREIGN PATENT DOCUMENTS

| | | |
|---|---|---|
| JP | 2007-19096 A | 1/2007 |
| JP | 2011-134829 A | 7/2011 |
| WO | WO 2009/069671 A1 | 6/2009 |

* cited by examiner

*Primary Examiner* — Laura Menz
*Assistant Examiner* — Candice Y Chan
(74) *Attorney, Agent, or Firm* — McGinn IP Law Group PLLC

(57) ABSTRACT

A light emitting device includes a semiconductor light emitting element that is disposed on a surface of a board, a transparent phosphor plate that includes phosphors, a transparent bonding member that fixedly bonds an upper surface of the semiconductor light emitting element to a lower surface of the phosphor plate, and a reflective layer that surrounds the semiconductor light emitting element and the phosphor plate and contains light-reflective fine particles. The semiconductor light emitting element includes an exposed portion that is provided near an outer peripheral edge of the upper surface of the semiconductor light emitting element and is not covered by the phosphor plate but exposed. A portion of an outer peripheral end surface of the phosphor plate, which is located near the upper surface of the phosphor plate, is not covered by the bonding member.

13 Claims, 17 Drawing Sheets

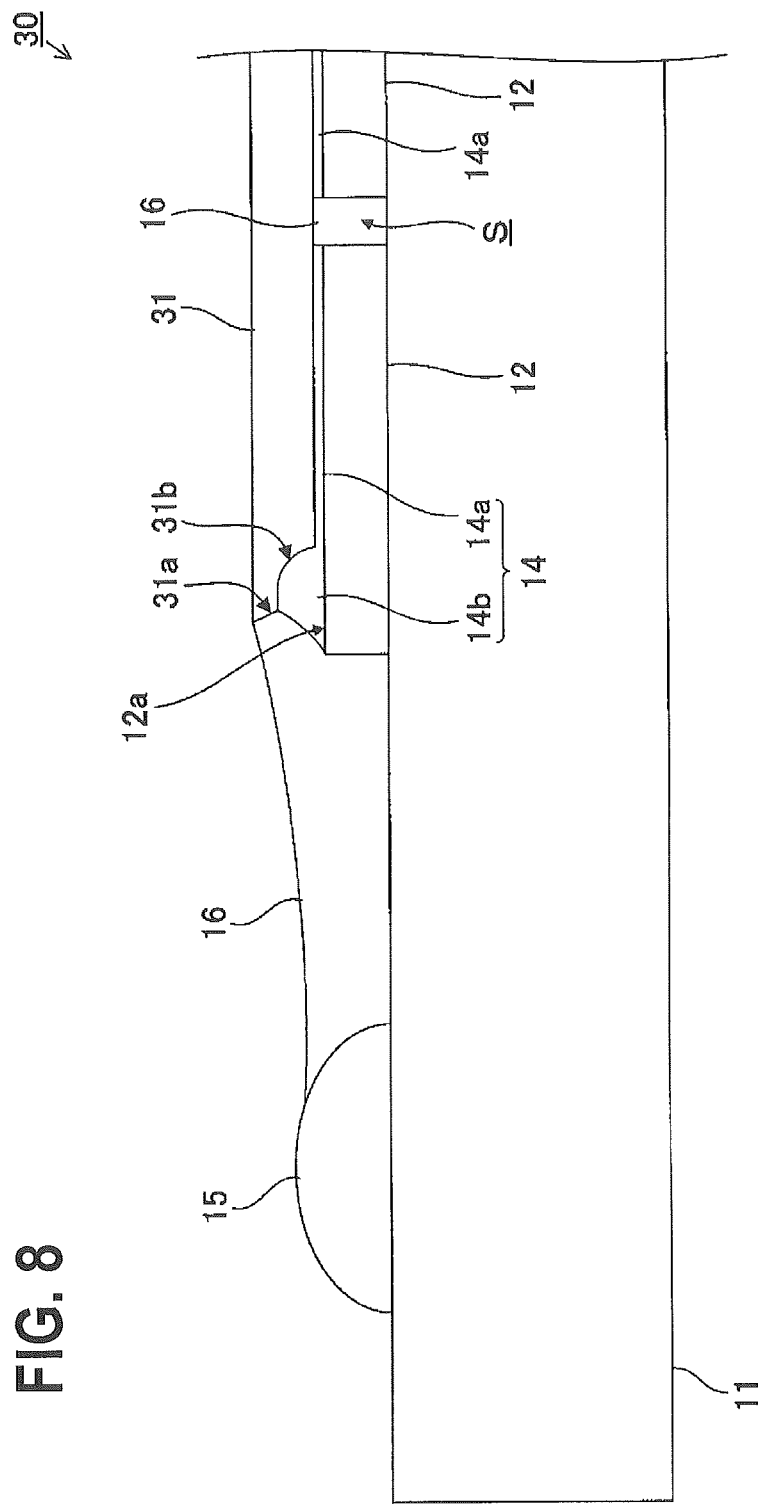

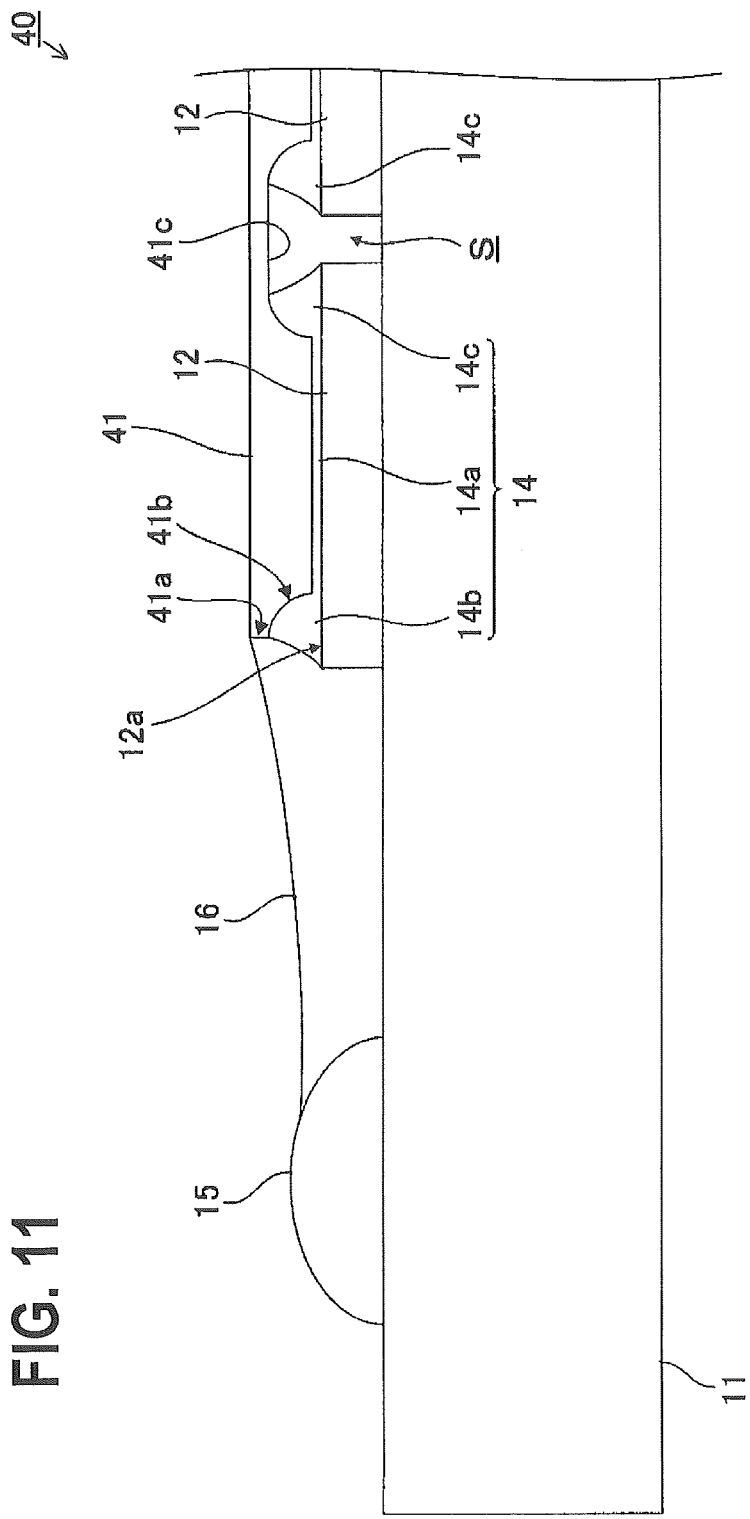

LIGHT EMITTING DEVICE

CROSS-REFERENCE TO RELATED APPLICATIONS

This application claims the benefit of Japanese Patent Application No. 2013-215150 (filed on Oct. 16, 2013), the entire contents of which are hereby incorporated by reference.

BACKGROUND

1. Technical Field

The present invention relates to a light emitting device and, more particularly, to a light emitting device including a semiconductor light emitting element.

2. Related Art

In Patent Document 1, a light emitting device is disclosed which includes a light emitting element, a mounting board for mounting the light emitting element thereon, a light transmission member for transmitting the light emitted from the light emitting element therethrough, a bonding member for fixedly bonding the light emitting element to the light transmission member, a light-reflective covering member for covering the side of the light transmission member and the light emitting element and a light-reflective frame provided on the mounting board and having the covering member filled therein. Here, the light transmission member is a plat-like body of a wavelength conversion member containing phosphors.

Patent Document 1: JP-A-2011-134829

In the technique disclosed in Patent Document 1, a primary light (blue light) is emitted from the light emitting element and a portion of the primary light is excited by the phosphors contained in the light transmission member (wavelength conversion member) to generate a wavelength-converted secondary light (yellow light). The primary light and the secondary light are mixed to generate a white light. The white light is emitted from the surface of the light transmission member, which is a light emitting surface of the light emitting device.

Here, the size of an external optical member (e.g., a reflector, a lens, etc.) having the light emitting device attached thereto can be reduced by reducing the area of the light emitting surface. Accordingly, it is required to reduce the area of the light transmission member that is a light emitting surface.

However, in the case where the area of the light transmission member is smaller than that of the upper surface of the light emitting element, the bonding member for fixedly bonding the light emitting element to the light transmission member sticks out from between the light emitting element and the light transmission member. Accordingly, there is a possibility that the whole peripheral end surface of the light transmission member is covered by the bonding member stuck out.

When the whole peripheral end surface of the light transmission member is covered by the bonding member, the primary light (blue light) of the light emitting element is transmitted through the bonding member and leaks to the outside of the light emitting device.

Then, the blue light emitted from the bonding member covering the whole peripheral end surface of the light transmission member is adversely noticeable against the white light emitted from the surface of the light transmission member. Accordingly, there is a problem that light emission quality is significantly reduced.

Accordingly, in the case where an amount of adhesive that is the bonding member is reduced in order to prevent the bonding member from sticking out from between the light emitting element and the light transmission member, there is a problem that a secure bonding fixation between the light emitting element and the light transmission member is hindered.

Further, a portion of the upper surface of the light emitting element is not covered by the light transmission member when the area of the light transmission member is smaller than that of the upper surface of the light emitting element. However, when the portion of the light emitting element is directly covered by a light-reflective covering member, the light emitted from the portion is blocked by the covering member, so that the light is not emitted to the outside from the light transmission member. Accordingly, there is a problem that the light extraction effect of the light emitting device is lowered.

The present invention has been made to solve the above-described problems and an object thereof is to provide a light emitting device where the light extraction effect can be improved, the area of a light emitting surface is small and the light emission quality is high.

The present inventors have intensively studied in order to solve the problems and reached each aspect of the present invention as described below.

<First Aspect>

A light emitting device includes a semiconductor light emitting element that is disposed on a surface of a board, a transparent phosphor plate that includes phosphors, a transparent bonding member that fixedly bonds an upper surface of the semiconductor light emitting element to a lower surface of the phosphor plate, and a reflective layer that surrounds the semiconductor light emitting element and the phosphor plate and contains light-reflective fine particles. The semiconductor light emitting element includes an exposed portion that is provided near an outer peripheral edge of the upper surface of the semiconductor light emitting element and is not covered by the phosphor plate but exposed. A portion of an outer peripheral end surface of the phosphor plate, which is located near the upper surface of the phosphor plate, is not covered by the bonding member. The exposed portion is covered by the reflective layer via the bonding member.

In the first aspect, a primary light is emitted from the semiconductor light emitting element and a portion of the primary light is excited by the phosphors contained in the phosphor plate to generate a wavelength-converted secondary light. The primary light and the secondary light are mixed to generate a mixed light. The mixed light is emitted from the surface of the phosphor plate, which is the light emitting surface of the light emitting device.

In the first aspect, the exposed portion which is not covered by the phosphor plate but exposed is provided near the outer peripheral edge of the upper surface of the semiconductor light emitting element. Accordingly, the area of the phosphor plate is smaller than that of the upper surface of the semiconductor light emitting element. As a result, it is possible to reduce the size of an external optical member (e.g., a reflector, a lens, etc.) having the light emitting device attached thereto.

Here, in the case where the area of the phosphor plate is smaller than that of the upper surface of the semiconductor light emitting element, the bonding member for fixedly bonding the semiconductor light emitting element to the phosphor plate sticks out from between the semiconductor light emitting element and the phosphor plate. Accordingly, there is a possibility that the whole peripheral end surface of the phosphor plate is covered by the bonding member stuck out.

When the whole peripheral end surface of the phosphor plate is covered by the bonding member, the primary light of the semiconductor light emitting element is transmitted through the bonding member and leaks to the outside of the light emitting device.

Then, the primary light emitted from the bonding member covering the whole peripheral end surface of the phosphor plate is adversely noticeable against the light emitted from the surface of the phosphor plate. Accordingly, there is a problem that light emission quality is significantly reduced.

However, in the first aspect, the portion of the outer peripheral end surface of the phosphor plate, which is located near the upper surface of the phosphor plate, is not covered by the bonding member.

Specifically, upon fixedly bonding the upper surface of the semiconductor light emitting element to the lower surface of the phosphor plate by the bonding member, there is no possibility that the bonding member stuck out covers the whole outer peripheral end surface of the phosphor plate even when the bonding member sticks out from between the semiconductor light emitting element and the phosphor plate.

Therefore, according to the first aspect, it can be prevented that the primary light of the semiconductor light emitting element is transmitted through the bonding member and leaks to the outside of the light emitting device. As a result, it is possible to provide the light emitting device where the light emission quality is high.

Further, in the first aspect, the portion of the outer peripheral end surface of the phosphor plate, other than the vicinity of the upper surface of the phosphor plate, is covered by the bonding member and the outer peripheral end surface of the phosphor plate is fixedly bonded to the semiconductor light emitting element via the bonding member covering the portion. Accordingly, it is possible to achieve a stronger bonding fixation, as compared to a case where only the upper surface of the semiconductor light emitting element and the lower surface of the phosphor plate are fixedly bonded to each other.

Meanwhile, the exposed portion which is not covered by the phosphor plate is provided in the upper surface of the semiconductor light emitting element when the area of the phosphor plate is smaller than that of the upper surface of the semiconductor light emitting element. However, when the exposed portion is directly covered by the reflective layer, the light emitted from the exposed portion is blocked by the reflective layer, so that the light is not emitted to the outside from the phosphor plate. Accordingly, there is a problem that the light extraction effect of the light emitting device is lowered.

However, in the first aspect, the exposed portion of the upper surface of the semiconductor light emitting element, which is not covered by the phosphor plate, is covered by the reflective layer via the bonding member, instead of being directly covered by the reflective layer.

Therefore, the light emitted from the exposed portion of the semiconductor light emitting element is transmitted through the bonding member covering the exposed portion, reflected at the reflective layer and then directed to the phosphor plate. In this way, the light is emitted to the outside from the phosphor plate, so that it is possible to improve the light extraction effect of the light emitting device.

<Second Aspect: Equivalent to First Embodiment and Second Embodiment>

In the light emitting device of the first aspect, an inclination portion is formed at the outer peripheral end surface of the phosphor plate, the inclination portion being connected to the lower surface of the phosphor plate at an obtuse angle and inclined in such a way that the area of the lower surface of the phosphor plate becomes smaller, and the bonding member includes a portion sandwiched between the upper surface of the semiconductor light emitting element and the lower surface of the phosphor plate, and a portion covering the exposed portion and the inclination portion.

In the second Aspect, the bonding member stuck out from between the semiconductor light emitting element and the phosphor plate forms the portion covering the exposed portion and the inclination portion by the surface tension thereof. The bonding member stuck out covers only the inclination portion. Accordingly, it is possible to reliably prevent the whole outer peripheral end surface of the phosphor plate from being covered by the bonding member stuck out.

Further, in the second aspect, the bonding member includes the portion covering the exposed portion and the inclination portion. Accordingly, the outer peripheral end surface of the phosphor plate is fixedly bonded to the semiconductor light emitting element via the portion of the bonding member. As a result, it is possible to reliably bond and fix the outer peripheral end surface of the phosphor plate to the semiconductor light emitting element.

Furthermore, in the second aspect, the light emitted from the exposed portion of the semiconductor light emitting element is transmitted through the portion of the bonding member, which covers the exposed portion and the inclination portion, reflected at the reflective layer and then directed to the phosphor plate. In this way, the light is emitted to the outside from the phosphor plate, so that it is possible to reliably improve the light extraction effect of the light emitting device.

Accordingly, according to the second aspect, it is possible to reliably obtain the operation/effect of the first aspect.

<Third Aspect: Equivalent to First Embodiment and Second Embodiment>

In the light emitting device of the second aspect, the inclination portion is formed only at the portion of the outer peripheral end surface of the phosphor plate, which is located near the lower surface of the phosphor plate.

In the third aspect, the bonding member stuck out from between the semiconductor light emitting element and the phosphor plate covers only the inclination portion. Accordingly, it can be reliably prevented that the portion near the upper surface of the outer peripheral end surface of the phosphor plate is covered by the bonding member stuck out. As a result, it is possible to reliably obtain the operation/effect of the second aspect.

<Fourth Aspect: Equivalent to Third Embodiment and Fourth Embodiment>

In the light emitting device of the first aspect, an undercut portion is formed at the outer peripheral end surface of the phosphor plate and has a shape that is obtained by cutting out a lower side of the phosphor plate, and the bonding member includes a portion sandwiched between the upper surface of the semiconductor light emitting element and the lower surface of the phosphor plate, and a portion covering the exposed portion and the undercut portion.

In the fourth aspect, the bonding member stuck out from between the semiconductor light emitting element and the phosphor plate forms the portion covering the exposed portion and the undercut portion by the surface tension thereof. The bonding member stuck out covers only the undercut portion. Accordingly, it is possible to reliably prevent the whole outer peripheral end surface of the phosphor plate from being covered by the bonding member stuck out.

Further, in the fourth aspect, the bonding member includes the portion covering the exposed portion and the undercut portion. Accordingly, the outer peripheral end surface of the phosphor plate is fixedly bonded to the semiconductor light emitting element via the portion of the bonding member. As a result, it is possible to reliably bond and fix the outer peripheral end surface of the phosphor plate to the semiconductor light emitting element.

Furthermore, in the fourth aspect, the light emitted from the exposed portion of the semiconductor light emitting element is transmitted through the portion of the bonding member, which covers the exposed portion and the undercut portion, reflected at the reflective layer and then directed to the phosphor plate. In this way, the light is emitted to the outside from the phosphor plate, so that it is possible to reliably improve the light extraction effect of the light emitting device.

Accordingly, according to the fourth aspect, it is possible to reliably obtain the operation/effect of the first aspect.

<Fifth Aspect: Equivalent to Third Embodiment and Fourth Embodiment>

In the light emitting device of the fourth aspect, the undercut portion is formed only at the portion of the outer peripheral end surface of the phosphor plate, which is located near the lower surface of the phosphor plate.

In the fifth aspect, the bonding member stuck out from between the semiconductor light emitting element and the phosphor plate covers only the undercut portion. Accordingly, it can be reliably prevented that the portion near the upper surface of the outer peripheral end surface of the phosphor plate is covered by the bonding member stuck out. As a result, it is possible to reliably obtain the operation/effect of the fourth aspect.

<Sixth Aspect: Equivalent to Fifth Embodiment>

In the light emitting device of the first aspect, an uppercut portion is formed at the outer peripheral end surface of the phosphor plate and has a shape that is obtained by cutting out an upper side of the phosphor plate, and the bonding member includes a portion sandwiched between the upper surface of the semiconductor light emitting element and the lower surface of the phosphor plate, and a portion covering only the exposed portion and a lower side of the uppercut portion.

In the sixth aspect, the bonding member stuck out from between the semiconductor light emitting element and the phosphor plate forms the portion covering only the exposed portion and the lower side of the uppercut portion by the surface tension thereof. The bonding member stuck out covers only the lower side of the uppercut portion. Accordingly, it is possible to reliably prevent the whole outer peripheral end surface of the phosphor plate from being covered by the bonding member stuck out.

Further, in the sixth aspect, the bonding member includes the portion covering only the exposed portion and the lower side of the uppercut portion. Accordingly, the outer peripheral end surface of the phosphor plate is fixedly bonded to the semiconductor light emitting element via the portion of the bonding member. As a result, it is possible to reliably bond and fix the outer peripheral end surface of the phosphor plate to the semiconductor light emitting element.

Furthermore, in the sixth aspect, the light emitted from the exposed portion of the semiconductor light emitting element is transmitted through the portion of the bonding member, which covers only the exposed portion and the lower side of the uppercut portion, reflected at the reflective layer and then directed to the phosphor plate. In this way, the light is emitted to the outside from the phosphor plate, so that it is possible to reliably improve the light extraction effect of the light emitting device.

Accordingly, according to the sixth aspect, it is possible to reliably obtain the operation/effect of the first aspect.

<Seventh Aspect: Equivalent to Fifth Embodiment>

In the light emitting device of the sixth aspect, the uppercut portion is formed only at the portion of the outer peripheral end surface of the phosphor plate, which is located near the upper surface of the phosphor plate.

In the seventh aspect, the bonding member stuck out from between the semiconductor light emitting element and the phosphor plate covers only the lower side of the uppercut portion. Accordingly, it can be reliably prevented that the portion near the upper surface of the outer peripheral end surface of the phosphor plate is covered by the bonding member stuck out. As a result, it is possible to reliably obtain the operation/effect of the sixth aspect.

<Eighth Aspect: Equivalent to First Embodiment>

In the light emitting device of any one of the first to seventh aspects, a plurality of semiconductor light emitting elements is arranged with gaps therebetween, and the phosphor plate is separately provided for each of the plurality of the semiconductor light emitting elements.

In the eighth aspect, the area of the phosphor plate is smaller than that of the upper surface of the semiconductor light emitting element and therefore intervals between respective phosphor plates can be widened. Accordingly, upon mounting the phosphor plate using a chip mounter, it can be prevented that the phosphor plate previously mounted is interfered with the phosphor plate later mounted. As a result, it is possible to easily produce the light emitting device.

<Ninth Aspect: Equivalent to Fourth Embodiment>

In the light emitting device of any one of the first to seventh aspects, a plurality of semiconductor light emitting elements is arranged with gaps therebetween, only one phosphor plate is provided for the plurality of the semiconductor light emitting elements, a recessed portion is formed at the lower surface of the phosphor plate and disposed so as to cover the gaps, and the bonding member includes a portion sandwiched between the upper surfaces of the semiconductor light emitting elements and the lower surface of the phosphor plate, and a portion covering the exposed portion and a portion of the recessed portion.

In the ninth aspect, the bonding member stuck out from between the semiconductor light emitting element and the phosphor plate forms the portion covering the exposed portion and a portion of the recessed portion by the surface tension thereof. Accordingly, it is possible to reliably prevent the whole outer peripheral end surface of the phosphor plate from being covered by the bonding member stuck out.

Further, in the ninth aspect, the bonding member includes the portion covering the exposed portion and a portion of the recessed portion. Accordingly, the outer peripheral end surface of the phosphor plate is fixedly bonded to the semiconductor light emitting element via the portion of the bonding member. As a result, it is possible to reliably bond and fix the outer peripheral end surface of the phosphor plate to the semiconductor light emitting element.

Accordingly, according to the ninth aspect, it is possible to reliably obtain the operation/effect of the first to seventh aspects.

BRIEF DESCRIPTION OF THE DRAWINGS

FIG. 8 is an enlarged longitudinal sectional view showing a main part (left part in FIG. 7A) of the light emitting device 30.

FIG. 11 is an enlarged longitudinal sectional view showing a main part (left part in FIG. 10 (A)) of the light emitting device 40.

DETAILED DESCRIPTION

Figure 1A:
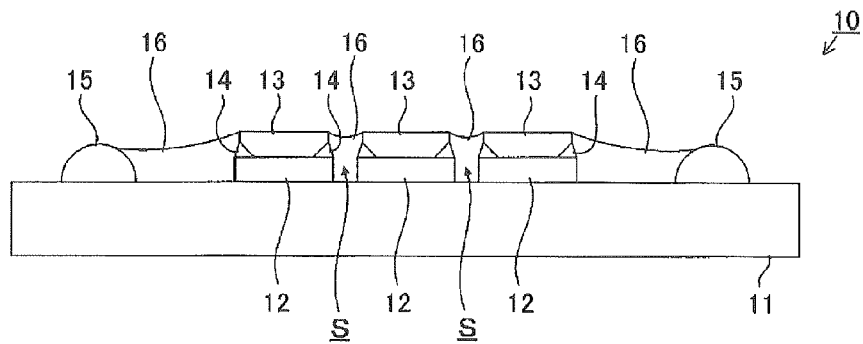
FIG. 1A is a longitudinal sectional view taken along an arrow X-X in FIG. 1B, showing a schematic configuration of a light emitting device 10 according to a first embodiment of the present invention

Hereinafter, respective embodiments of the present invention will be described with reference to the drawings. In respective embodiments, the same reference numerals are applied to the same components and elements and a duplicated description of the same components and elements will be omitted.

Further, in each drawing, in order to simplify the description, the size, shape and arrangement of the components are schematically shown in an exaggerated manner. Further, the size, shape and arrangement of the components are different from the actual.

First Embodiment

Figure 1B:
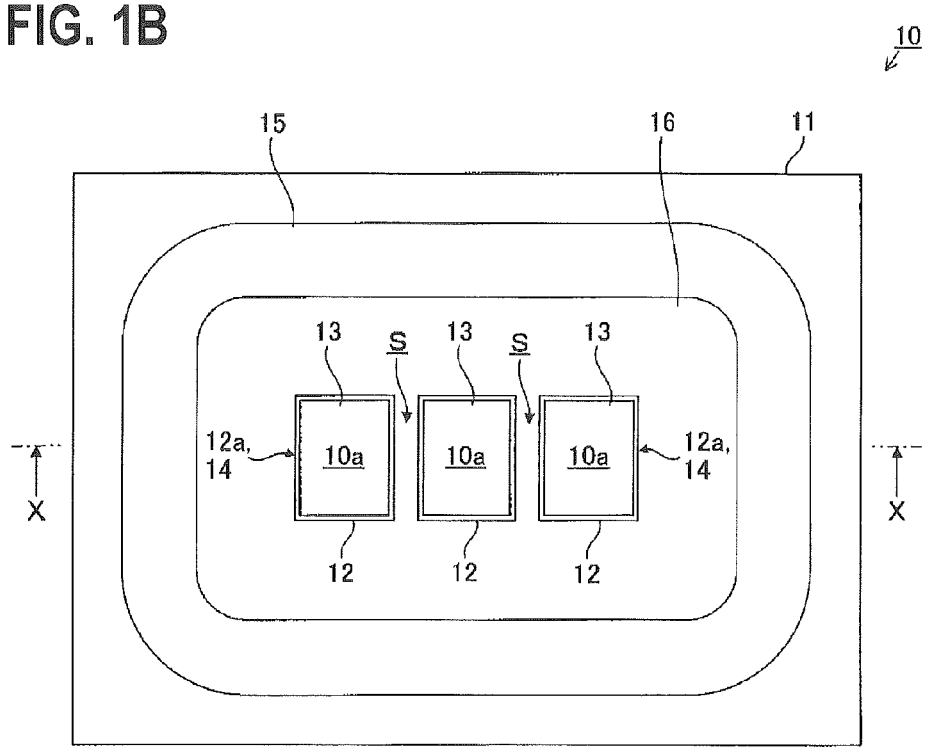
FIG. 1B is a plan view of the light emitting device 10.
Figure 2:
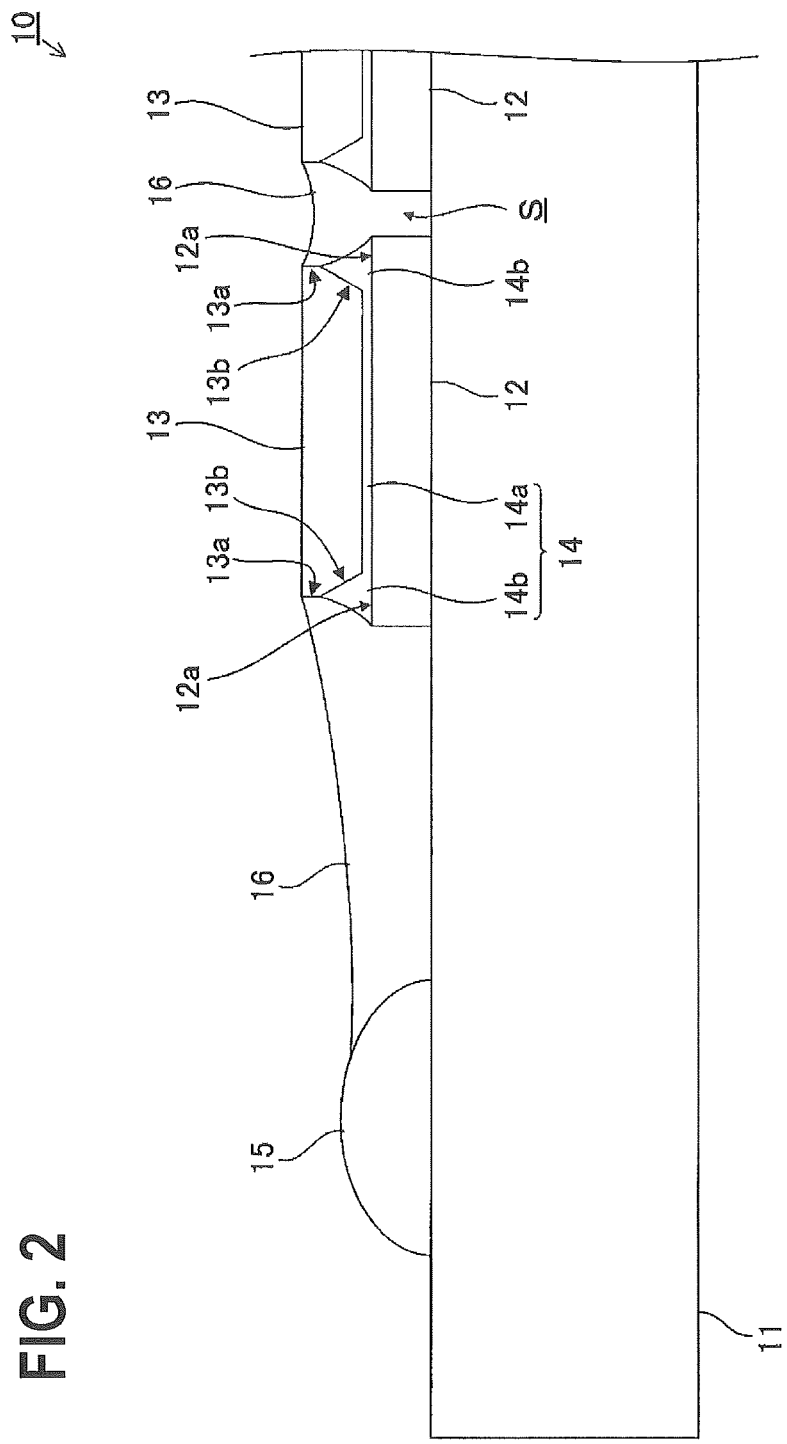
FIG. 2 is an enlarged longitudinal sectional view showing a main part (left part in FIG. 1A) of the light emitting device 10.

As shown in FIGS. 1A and 1B and FIG. 2, a light emitting device 10 of a first embodiment includes an insulation board 11, an LED (Light Emitting Diode) chip 12 (an exposed portion 12a), a phosphor plate 13 (a vertical portion 13a and an inclination portion 13b), a bonding member 14 (portions 14a, 14b), a frame 15, a reflective layer 16 and a light emitting surface 10a.

The insulation board (mounting board) 11 has a substantially rectangular flat shape, as seen in a plan view. For example, the insulation board 11 is formed by a board made of a bulk material of an insulating material (e.g., ceramics material such as aluminum nitride, synthetic resin material, etc.) or a board where an insulating layer is provided on a surface of a metallic material (e.g., aluminum alloy, pure copper, copper-based alloy, etc.).

Three LED chips 12 are blue LEDs having a substantially rectangular parallelepiped shape and arranged in a row with a gap S therebetween.

The lower surface of each LED chip 12 is electrically connected and fixedly bonded to wiring layers (not shown) formed on the surface of the insulation board 11 using various bonding methods (e.g., soldering, stud bump bonding, metallic fine particle bonding, surface activation bonding, etc.).

The exposed portion 12a which is not covered by the phosphor plate 13 but exposed is provided near the outer peripheral edge of the upper surface of each LED chip 12.

Each of three phosphor plates 13 has a flat shape that is the same as but slightly smaller than the upper surface of each LED chip 12. The vertical portion (straight portion, vertical end surface) 13a and the inclination portion (inclined end surface) 13b are formed at the outer peripheral end surface (side end surface) of each phosphor plate 3.

The vertical portion 13a is vertically connected to the upper surface of each phosphor plate 13.

The inclination portion 13b is connected to the lower end of the vertical portion 13a and the lower surface of the phosphor plate 13 at an obtuse angle. The inclination portion 13b is inclined in such a way that the area of the lower surface of each phosphor plate 13 becomes smaller.

Further, each phosphor plate 13 is formed by a transparent material (e.g., synthetic resin material, glass material, etc.) containing fine particles of the phosphors (e.g., YAG (Yttrium Aluminum Garnet)-based phosphors, etc.) and functions as a wavelength conversion member (wavelength conversion layer).

Each phosphor plate 13 is respectively placed on each LED chip 12 via the bonding member 14 so that the inclination portion 13b is opposed to the upper surface of each LED chip 12.

Further, the surface of each phosphor plate 13 is the light emitting surface 10a (a light emission region, an emitting region, a light emitting part) of the light emitting device 10.

The bonding member 14 fixedly bonds the upper surface of each LED chip 12 to the lower surface of each phosphor plate 13 and includes the portions 14a, 14b.

The portion 14a is sandwiched between the upper surface of each LED chip 12 and the lower surface of each phosphor plate 13 and is a flat thin film.

The portion 14b covers the inclination portion 13b of each phosphor plate 13 and the exposed portion 12a near the outer peripheral edge of the upper surface of each LED chip 12, which is not covered by each phosphor plate 13 but exposed. The outer peripheral surface of the portion 14b has a shape (fillet shape) that spreads in a skirt manner toward the upper surface of each LED chip 12.

Further, the bonding member 14 is made of adhesive of transparent (light transmitting) thermoplastic synthetic resin material (e.g., silicone resin, epoxy resin, etc.).

The frame 15 has a substantially rectangular frame shape, as seen in a plan view. Four corners of the frame 15 are rounded, as seen in a plan view. The frame 15 is disposed on the surface of the insulation board 11 so as to surround each LED chip 12 that is covered by each phosphor plate 13.

Further, the frame 15 is formed by a white synthetic resin material (e.g., silicone resin, epoxy resin, etc.) containing fine particles of material (e.g., titanium oxide, aluminum oxide, etc.) with high light reflectivity, a light-reflective ceramics material (e.g., aluminum oxide, etc.), a light-reflective metallic material (e.g., aluminum alloy, etc.), or the like.

The reflective layer 16 surrounds each LED chip 12 and each phosphor plate 13.

Further, the reflective layer 16 is filled into a space surrounded by the outer peripheral surface of each LED chip 12, the vertical portion 13a of each phosphor plate 13, the outer peripheral surface of the portion 14b of the bonding member 14, the surface of the insulation board 11 exposed from each LED chip 12 and the inner peripheral wall surface of the frame 15. The reflective layer 16 is injected to the inside of the frame 15 so that the reflective layer seals each LED chip 12, each phosphor plate 13 and the bonding member 14 and is filled into the gap S of each LED chip 12.

Furthermore, the reflective layer 16 is formed by a white synthetic resin material (e.g., silicone resin, epoxy resin, etc.) containing fine particles of material (e.g., titanium oxide, aluminum oxide, etc.) with high light reflectivity.

[Manufacturing Method of First Embodiment]

Figure 3A:
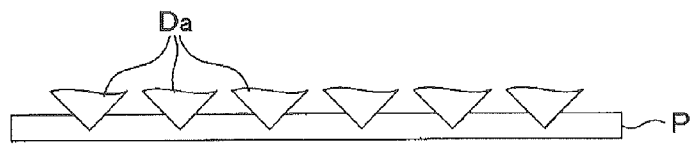
FIGS. 3A to 3D are longitudinal sectional views for explaining a manufacturing method of the light emitting device 10.
Figure 3B:
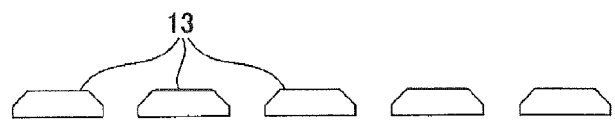

First process (see FIGS. 3A and 3B): Each phosphor plate 13 is produced from a plate material P by cutting out the plate material P of transparent material (light transmitting material) containing fine particles of the phosphor using a dicing blade Da of a dicing apparatus to form grooves with a substantially V-shaped cross-section in a square shape (not shown) on the surface of the plate material P and then cutting and separating the plate material P.

Here, the cross-section shape of the dicing blade Da corresponds to the shape of the inclination portion 13b of each phosphor plate 13.

Figure 3C:
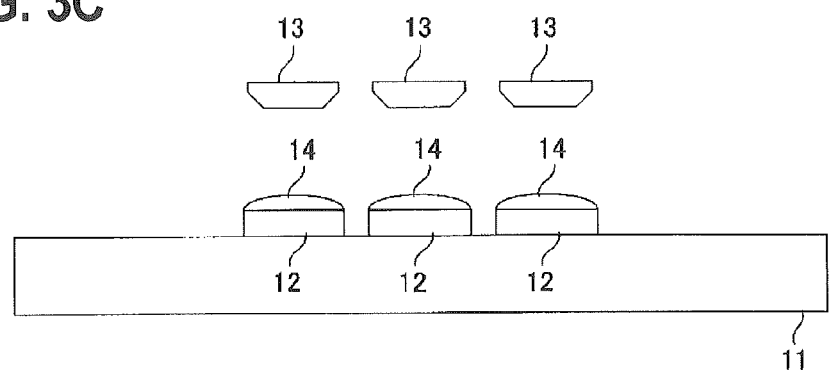

Second process (see FIG. 3C): Each LED chip 12 is bonded to wiring layers (not shown) formed on the surface of the insulation board 11.

Then, liquid adhesive for forming the bonding member 14 is applied only on the upper surface of each LED chip 12 using a dispenser (not shown) or a screen printing device (not shown).

Subsequently, each phosphor plate 13 is placed so as to face the upper side of each LED chip 12 using a chip mounter (not shown).

Figure 3D:
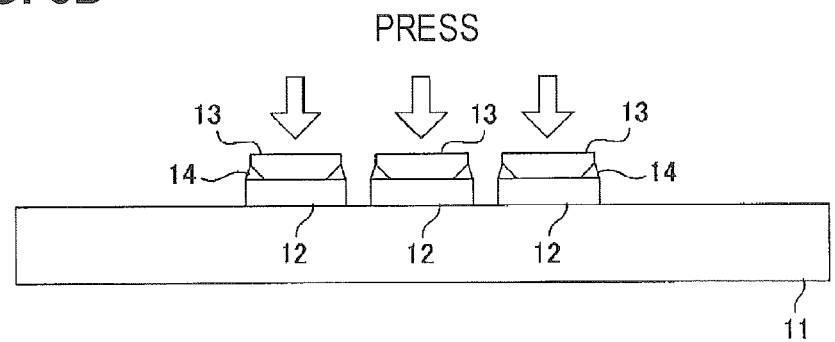

Third process (see FIG. 3D): Load is applied to perform pressing by pushing the lower surface of each phosphor plate 13 against the upper surface of each LED chip 12 using a chip mounter.

Next, the members pressed are accommodated in a thermostatic bath (not shown) and processed by heating, so that the bonding member 14 is thermally cured. In this way, each LED chip 12 and each phosphor plate 13 are fixedly bonded to each other via the bonding member 14.

Then, the film thickness of the portion 14a of the bonding member 14 sandwiched between each LED chip 12 and each phosphor plate 13 becomes uniform.

Here, it is desirable that the film thickness of the portion 14a is thinner, as long as each LED chip 12 and each phosphor plate 13 can be securely fixed to each other. It is desirable that the film thickness is preferably 10 µm or less, more preferably 2 µm or less.

At the same time, the adhesive stuck out from between each LED chip 12 and each phosphor plate 13 forms the portion 14b of the bonding member 14 by the surface tension thereof.

Here, the adhesive stuck out from between each LED chip 12 and each phosphor plate 13 covers only the inclination portion 13b of each phosphor plate 13. The vertical portion 13a of each phosphor plate 13 is not covered by the bonding member 14 but exposed.

Fourth process (see FIG. 1 and FIG. 2): A liquid material for forming the reflective layer 16 is injected into a space surrounded by the outer peripheral surface of each LED chip 12, the vertical portion 13a of each phosphor plate 13, the outer peripheral surface of the portion 14b of the bonding member 14, the surface of the insulation board 11 exposed from each LED chip 12 and the inner peripheral wall surface of the frame 15. Then, the reflective layer 16 is cured.

In this way, the reflective layer 16 cured functions as adhesive so that each LED chip 12 and each phosphor plate 13, the insulation board 11 and the frame 15 are fixedly bonded via the reflective layer 16.

Further, the reflective layer 16 cured is also filled into the gap S of each LED chip 12.

[Operation/Effect of First Embodiment]

According to the light emitting device 10 of the first embodiment, the following operation/effect can be achieved.

[1-1] The light emitting device 10 includes the LED chip 12 (semiconductor light emitting element) formed on the surface of the insulation board 11, the transparent phosphor plate 13 containing phosphors, a transparent bonding member 14 for fixedly bonding the upper surface of the LED chip 12 to the lower surface of the phosphor plate 13, and the reflective layer 16 containing the light-reflective fine particles while surrounding the LED chip 12 and the phosphor plate 13.

The exposed portion 12a which is not covered by the phosphor plate 13 but exposed is provided near the outer peripheral edge of the upper surface of the LED chip 12.

The vertical portion 13a (portion near the upper surface of the phosphor plate 13) of the outer peripheral end surface of the phosphor plate 13 is not covered by the bonding member 14.

The exposed portion 12a of the LED chip 12 is covered by the reflective layer 16 via the bonding member 14.

In the light emitting device 10, a primary light (blue light) is emitted from the LED chip 12 and a portion of the primary light is excited by the phosphors contained in the phosphor plate 13 to generate a wavelength-converted secondary light (yellow light). The primary light and the secondary light are mixed to generate a white light. The white light generated is emitted from the surface of the phosphor plate 13, which is the light emitting surface 10a of the light emitting device 10.

In the light emitting device 10, the exposed portion 12a which is not covered by the phosphor plate 13 but exposed is provided near the outer peripheral edge of the upper surface of the LED chip 12. Accordingly, the area of the phosphor plate 13 is smaller than that of the upper surface of the LED chip 12. As a result, it is possible to reduce the size of an external optical member (e.g., a reflector, a lens, etc.) having the light emitting device 10 attached thereto.

Here, in the case where the area of the phosphor plate 13 is smaller than that of the upper surface of the LED chip 12, the bonding member 14 for fixedly bonding the LED chip 12 to the phosphor plate 13 sticks out from between the LED chip 12 and the phosphor plate 13. Accordingly, there is a possibility that the whole peripheral end surface of the phosphor plate 13 is covered by the bonding member 14 stuck out.

When the whole peripheral end surface of the phosphor plate 13 is covered by the bonding member 14, the primary light of the LED chip 12 is transmitted through the bonding member 14 and leaks to the outside of the light emitting device 10.

Then, the primary light (blue light) emitted from the bonding member 14 covering the whole peripheral end surface of the phosphor plate 13 is adversely noticeable against the white light emitted from the surface of the phosphor plate 13. Accordingly, there is a problem that light emission quality is significantly reduced.

However, in the light emitting device 10, the vertical portion 13a (portion near the upper surface of the phosphor plate 13) of the outer peripheral end surface of the phosphor plate 13 is not covered by the bonding member 14.

Specifically, upon fixedly bonding the upper surface of the LED chip 12 to the lower surface of the phosphor plate 13 by the bonding member 14, there is no possibility that the bonding member 14 stuck out covers the whole outer peripheral end surface of the phosphor plate 13 even when the bonding member 14 sticks out from between the LED chip 12 and the phosphor plate 13.

Therefore, according to the first embodiment, it can be prevented that the primary light of the LED chip 12 is transmitted through the bonding member 14 and leaks to the outside of the light emitting device 10. As a result, it is possible to provide the light emitting device 10 where the light emission quality is high.

Further, in the light emitting device 10, the inclination portion 13b (portion other than the vicinity of the upper surface of the phosphor plate 13) of the outer peripheral end surface of the phosphor plate 13 is covered by the bonding member 14 and the outer peripheral end surface of the phosphor plate 13 is fixedly bonded to the LED chip 12 via the bonding member 14 covering the inclination portion 13b. Accordingly, it is possible to achieve a stronger bonding fixation, as compared to a case where only the upper surface of the LED chip 12 and the lower surface of the phosphor plate 13 are fixedly bonded to each other.

Meanwhile, the exposed portion 12a which is not covered by the phosphor plate 13 is provided in the upper surface of the LED chip 12 when the area of the phosphor plate 13 is smaller than that of the upper surface of the LED chip 12. However, when the exposed portion 12a is directly covered by the reflective layer 16, the light emitted from the exposed portion 12a is blocked by the reflective layer 16, so that the light is not emitted to the outside from the phosphor plate 13. Accordingly, there is a problem that the light extraction effect of the light emitting device 10 is lowered.

However, in the light emitting device 10, the exposed portion 12a of the upper surface of the LED chip 12, which is not covered by the phosphor plate 13, is covered by the reflective layer 16 via the bonding member 14, instead of being directly covered by the reflective layer 16.

Therefore, the light emitted from the exposed portion 12a of the LED chip 12 is transmitted through the portion 14b of the bonding member 14 covering the exposed portion 12a, reflected at the reflective layer 16 and then directed to the phosphor plate 13. In this way, the light is emitted to the outside from the phosphor plate 13, so that it is possible to improve the light extraction effect of the light emitting device 10.

[1-2] The inclination portion 13b is formed at the outer peripheral end surface of the phosphor plate 13. The inclination portion 13b is connected to the lower surface of the phosphor plate 13 at an obtuse angle and inclined in such a way that the area of the lower surface of the phosphor plate 13 becomes smaller.

The bonding member 14 includes the portion 14a sandwiched between the upper surface of the LED chip 12 and the lower surface of the phosphor plate 13, and the portion 14b covering the exposed portion 12a of the LED chip 12 and the inclination portion 13b of the phosphor plate 13.

In the light emitting device 10, the bonding member 14 stuck out from between the LED chip 12 and the phosphor plate 13 forms the portion 14b covering the exposed portion 12a of the LED chip 12 and the inclination portion 13b of the phosphor plate 13 by the surface tension thereof. The bonding member 14 stuck out covers only the inclination portion 13b. The vertical portion 13a of the phosphor plate 13 is not covered by the bonding member 14. Accordingly, it is possible to reliably prevent the whole outer peripheral end surface of the phosphor plate 13 from being covered by the bonding member 14 stuck out.

Further, in the light emitting device 10, the bonding member 14 includes the portion 14b covering the exposed portion 12a of the LED chip 12 and the inclination portion 13b of the phosphor plate 13. Accordingly, the outer peripheral end surface of the phosphor plate 13 is fixedly bonded to the LED chip 12 via the portion 14b of the bonding member 14. As a result, it is possible to reliably bond and fix the outer peripheral end surface of the phosphor plate 13 to the LED chip 12, as compared to a case where only the portion 14a of the bonding member 14 is provided.

Furthermore, in the light emitting device 10, the light emitted from the exposed portion 12a of the LED chip 12 is transmitted through the portion 14b of the bonding member 14, reflected at the reflective layer 16 and then directed to the phosphor plate 13. In this way, the light is emitted to the outside from the phosphor plate 13, so that it is possible to reliably improve the light extraction effect.

[1-3] The inclination portion 13b of the phosphor plate 13 is formed only at the portion near the lower surface of the outer peripheral end surface of the phosphor plate 13.

Therefore, in the light emitting device 10, the bonding member 14 stuck out from between the LED chip 12 and the phosphor plate 13 covers only the inclination portion 13b of the phosphor plate 13. Accordingly, it can be reliably prevented that the vertical portion 13a (portion near the upper surface of the outer peripheral end surface of the phosphor plate 13) of the phosphor plate 13 is covered by the bonding member 14 stuck out. As a result, it is possible to reliably obtain the operation/effect of the [1-2].

[1-4] The light emitting device 10 includes three LED chips 12 arranged with gaps S therebetween and each of three phosphor plates 13 is separately provided for each of three LED chips 12.

In the first embodiment, the area of the phosphor plate 13 is smaller than that of the upper surface of the LED chip 12 and therefore intervals (widths of the gaps S) between respective phosphor plates 13 can be widened. Accordingly, upon mounting the phosphor plate 13 using a chip mounter, it can be prevented that the phosphor plate 13 previously mounted is interfered with the phosphor plate 13 later mounted. As a result, it is possible to easily produce the light emitting device 10.

Second Embodiment

Figure 4A:
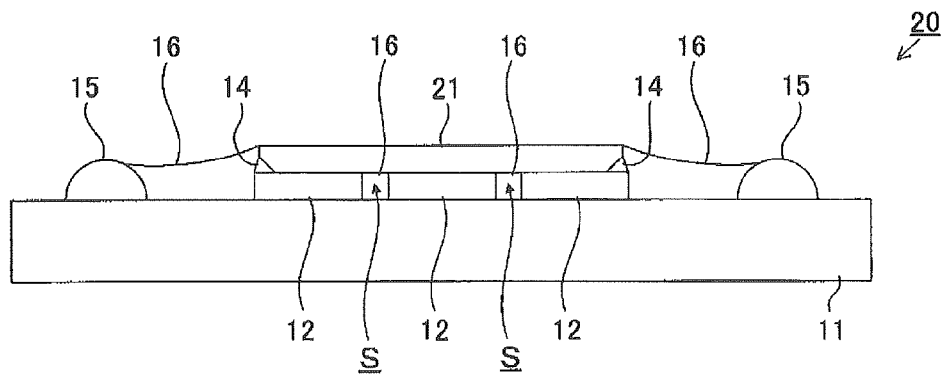
FIG. 4A is a longitudinal sectional view taken along an arrow X-X in FIG. 4B, showing a schematic configuration of a light emitting device 20 according to a second embodiment of the present invention
Figure 4B:
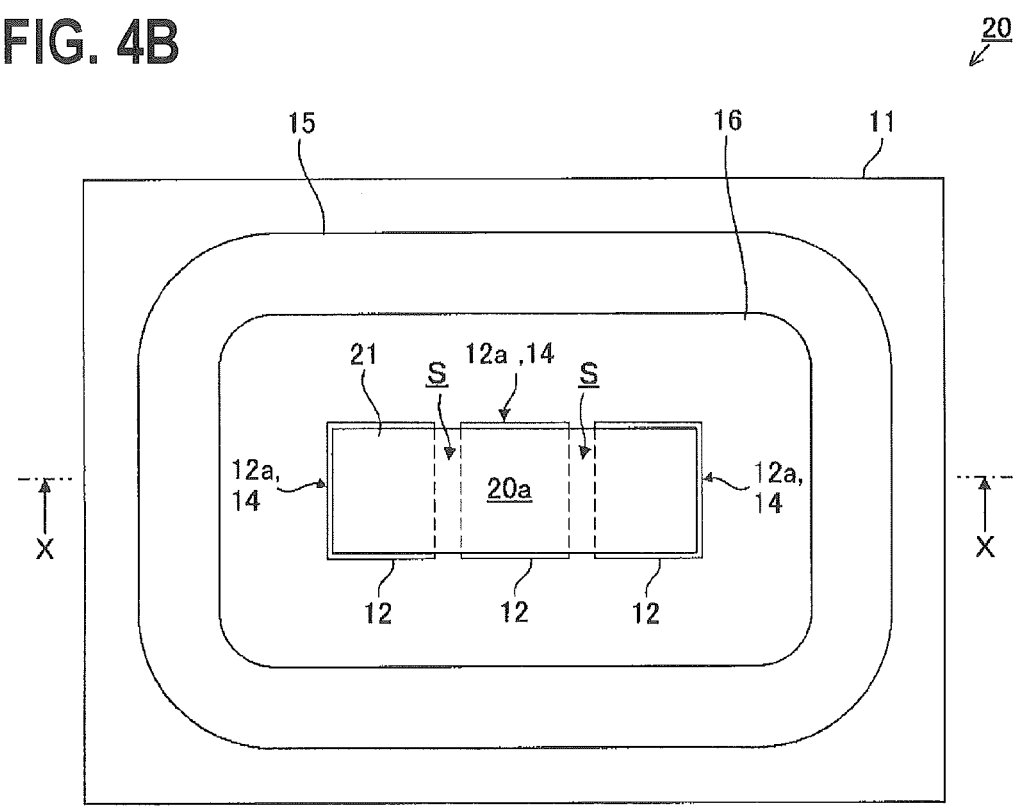
FIG. 4B is a plan view of the light emitting device 20.
Figure 5:
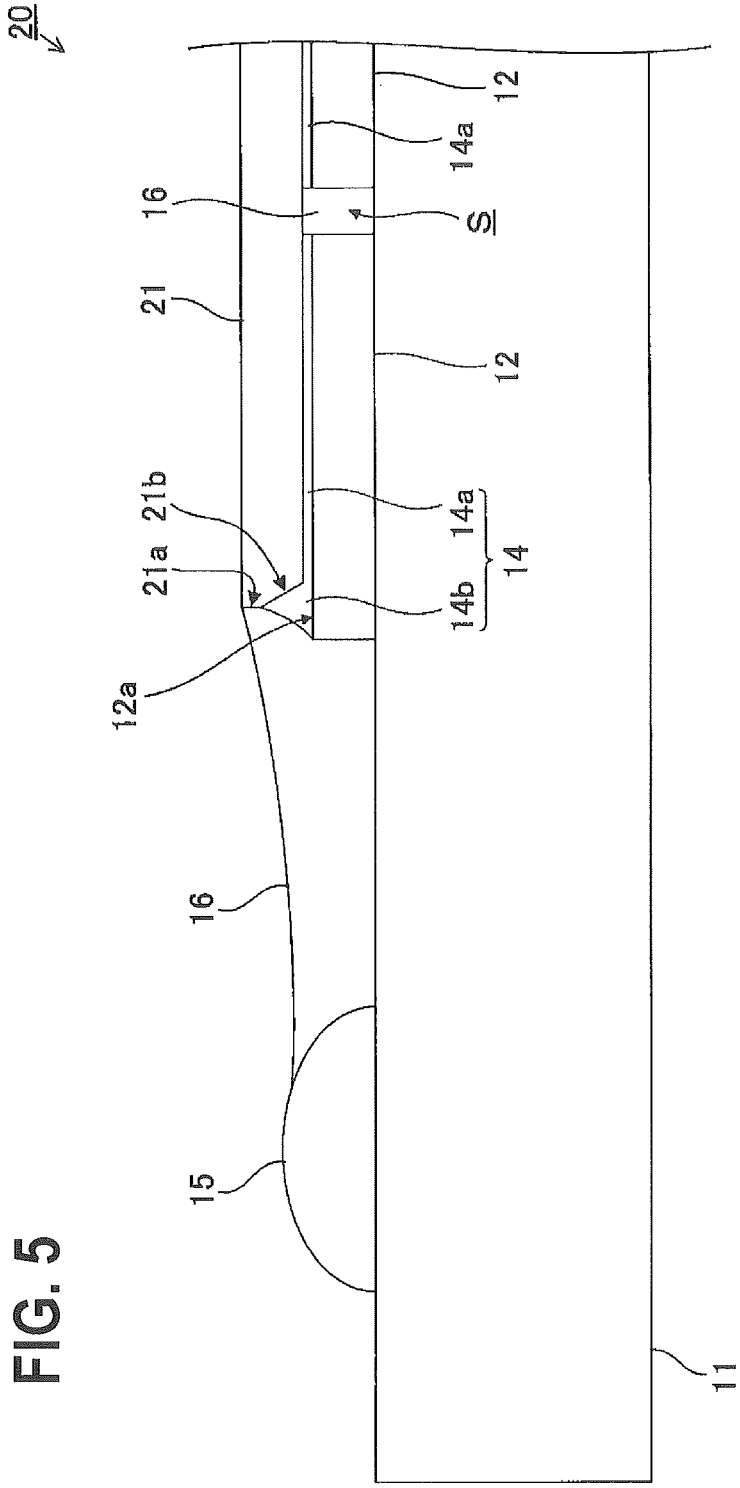
FIG. 5 is an enlarged longitudinal sectional view showing a main part (left part in FIG. 4A) of the light emitting device 20.
Figure 6A:
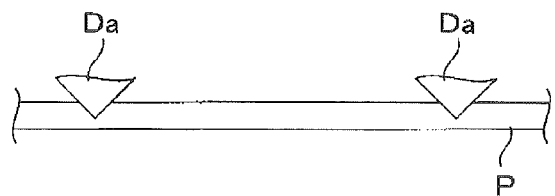
FIGS. 6A to 6D are longitudinal sectional views for explaining a manufacturing method of the light emitting device 20.
Figure 6B:
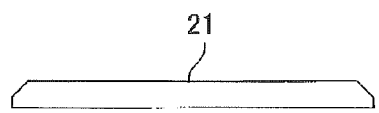
Figure 6C:
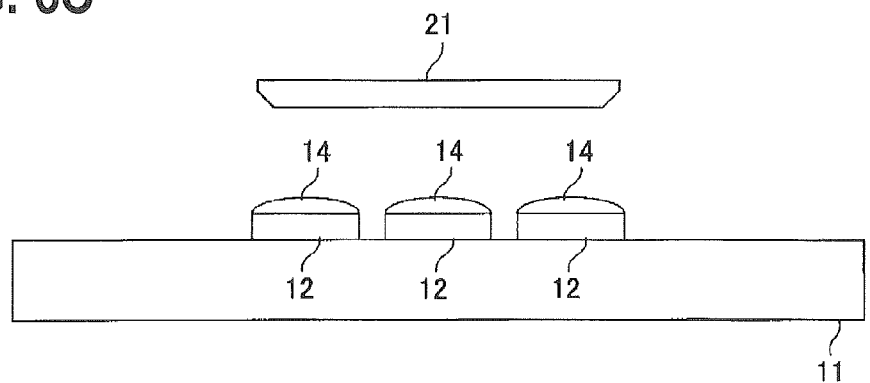
Figure 6D:
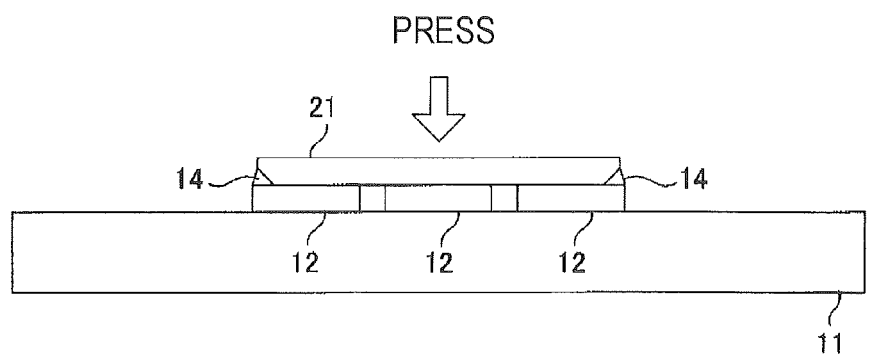

As shown in FIG. 4 and FIG. 5, a light emitting device 20 of a second embodiment includes the insulation board 11, the LED chip 12 (the exposed portion 12a), a phosphor plate 21 (a vertical portion 21a and an inclination portion 21b), the bonding member 14 (the portions 14a, 14b), the frame 15, the reflective layer 16 and a light emitting surface 20a.

The light emitting device 20 of the second embodiment is different from the light emitting device 10 of the first embodiment only in the following points.

[2-A] Three phosphor plates 13 in the first embodiment are substituted with one phosphor plate 21 in the second embodiment.

The phosphor plate 21 has a substantially rectangular flat shape that is slightly smaller than the sum of the dimension of the upper surfaces of three LED chips 12 arranged and the gaps S between respective LED chips 12, as seen in a plan view. The vertical portion 21a and the inclination portion 21b are formed at the outer peripheral end surface of the phosphor plate 21.

The vertical portion 21a is vertically connected to the upper surface of the phosphor plate 21.

The inclination portion 21b is connected to the lower end of the vertical portion 21a and the lower surface of the phosphor plate 21 at an obtuse angle. The inclination portion 21b is inclined in such a way that the area of the lower surface of the phosphor plate 21 becomes smaller.

Material of the phosphor plate 21 is the same as that of the phosphor plate 13.

The phosphor plate 21 is placed on each LED chip 12 via the bonding member 14 so that the inclination portion 21b is opposed to the upper surface of each LED chip 12.

Further, the surface of the phosphor plate 21 is the light emitting surface 20a of the light emitting device 20.

[2-B] The bonding member 14 fixedly bonds the upper surface of each LED chip 12 to the lower surface of the phosphor plate 21.

The portion 14a of the bonding member 14 is sandwiched between the upper surface of each LED chip 12 and the lower surface of the phosphor plate 21 and is a flat thin film.

The portion 14b of the bonding member 14 covers the exposed portion 12a near the outer peripheral edge of the upper surface of each LED chip 12 and the inclination portion 21b of the phosphor plate 21. The exposed portion 12a is not covered by the phosphor plate 21 but exposed.

[2-C] The reflective layer 16 surrounds each LED chip 12 and the phosphor plate 21.

Further, the reflective layer 16 is filled into a space surrounded by the outer peripheral surface of each LED chip 12, the vertical portion 21a of the phosphor plate 21, the outer peripheral surface of the portion 14b of the bonding member 14, the surface of the insulation board 11 exposed from each LED chip 12 and the inner peripheral wall surface of the frame 15. The reflective layer 16 is injected to the inside of the frame 15 so that the reflective layer seals each LED chip 12, the phosphor plate 21 and the bonding member 14 and is filled into the gap S of each LED chip 12.

[Manufacturing Method of Second Embodiment]

First process (see FIG. 6 (A),B): The phosphor plate 21 is produced from a plate material P by cutting out the plate material P of transparent material containing fine particles of the phosphor using a dicing blade Da of a dicing apparatus to form grooves with a substantially V-shaped cross-section in a square shape (not shown) on the surface of the plate material P and then cutting and separating the plate material P.

Here, the cross-section shape of the dicing blade Da corresponds to the shape of the inclination portion 21b of the phosphor plate 21.

Second process (see FIG. 6C): Each LED chip 12 is bonded to wiring layers formed on the surface of the insulation board 11.

Then, liquid adhesive for forming the bonding member 14 is applied only on the upper surface of each LED chip 12 using a dispenser or a screen printing device.

Subsequently, the phosphor plate 21 is placed so as to face the upper side of each LED chip 12 using a chip mounter.

Third process (see FIG. 6D): Load is applied to perform pressing by pushing the lower surface of the phosphor plate 21 against the upper surface of each LED chip 12 using a chip mounter.

Next, the members pressed are accommodated in a thermostatic bath and processed by heating, so that the bonding member 14 is thermally cured. In this way, each LED chip 12 and the phosphor plate 21 are fixedly bonded to each other via the bonding member 14.

Then, the film thickness of the portion 14a of the bonding member 14 sandwiched between each LED chip 12 and the phosphor plate 21 becomes uniform.

At the same time, the adhesive stuck out from between each LED chip 12 and the phosphor plate 21 forms the portion 14b of the bonding member 14 by the surface tension thereof.

Here, the adhesive stuck out from between each LED chip 12 and the phosphor plate 21 covers only the inclination portion 21b of the phosphor plate 21. The vertical portion 21a of the phosphor plate 21 is not covered by the bonding member 14 but exposed.

Fourth process (see FIG. 4 and FIG. 5): A liquid material for forming the reflective layer 16 is injected into a space surrounded by the outer peripheral surface of each LED chip 12, the vertical portion 21a of the phosphor plate 21, the outer peripheral surface of the portion 14b of the bonding member 14, the surface of the insulation board 11 exposed from each LED chip 12 and the inner peripheral wall surface of the frame 15. Then, the reflective layer 16 is cured.

In this way, the reflective layer 16 cured functions as adhesive so that each LED chip 12 and the phosphor plate 21, the insulation board 11 and the frame 15 are fixedly bonded via the reflective layer 16.

[Operation/Effect of Second Embodiment]

According to the light emitting device 20 of the second embodiment, it is possible to obtain the same operation/effect as the [1-1] to [1-3] in the light emitting device 10 of the first embodiment.

Third Embodiment

Figure 7A:
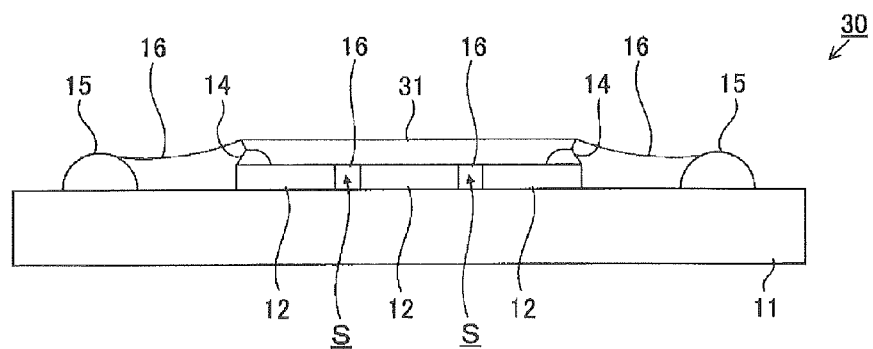
FIG. 7A is a longitudinal sectional view taken along an arrow X-X in FIG. 7B, showing a schematic configuration of a light emitting device 30 according to a third embodiment of the present invention
Figure 7B:
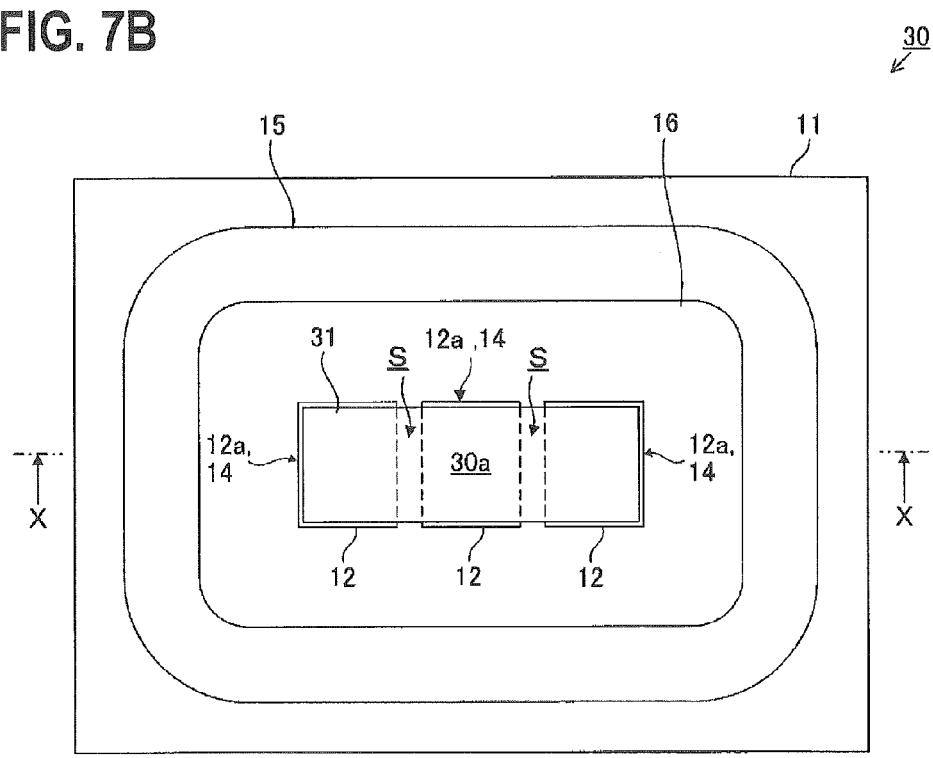
FIG. 7B is a plan view of the light emitting device 30.
Figure 9A:
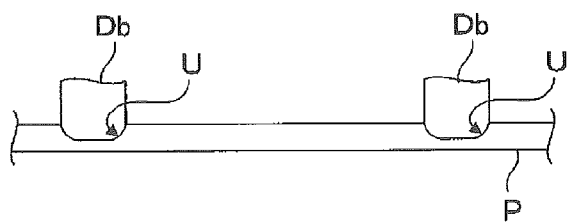
FIGS. 9A to 9E are longitudinal sectional views for explaining a manufacturing method of the light emitting device 30.
Figure 9B:
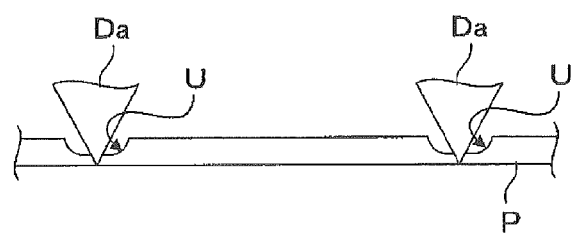
Figure 9C:
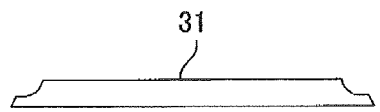
Figure 9D:
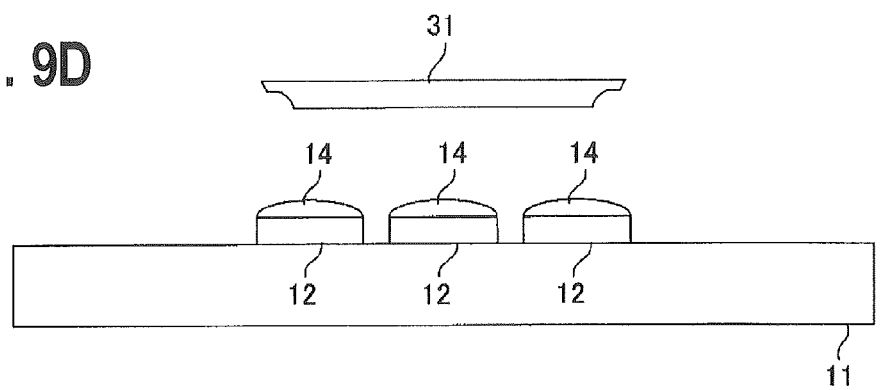
Figure 9E:
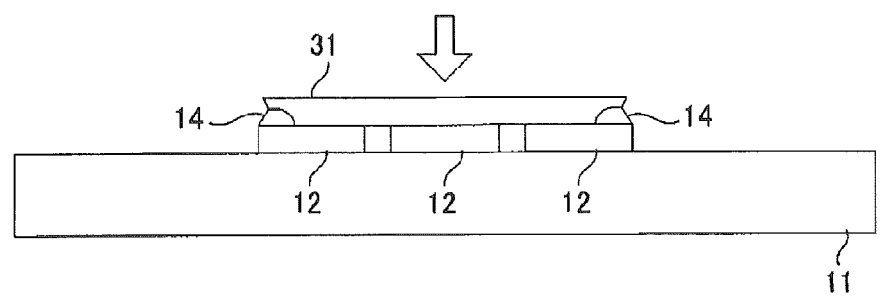

As shown in FIG. 7 and FIG. 8, a light emitting device 30 of a third embodiment includes the insulation board 11, the LED chip 12 (the exposed portion 12a), a phosphor plate 31 (an inclination portion 31a and an undercut portion 31b), the bonding member 14 (the portions 14a, 14b), the frame 15, the reflective layer 16 and a light emitting surface 30a.

The light emitting device 30 of the third embodiment is different from the light emitting device 10 of the first embodiment only in the following points.

[3-A] Three phosphor plates 13 in the first embodiment are substituted with one phosphor plate 31 in the third embodiment.

The phosphor plate 31 has a substantially rectangular flat shape that is slightly smaller than the sum of the dimension of the upper surfaces of three LED chips 12 arranged and the gaps S between respective LED chips 12, as seen in a plan view. The inclination portion 31a and the undercut portion 31b are formed at the outer peripheral end surface of the phosphor plate 31.

The inclination portion 31a is connected to the upper surface of the phosphor plate 31 at an acute angle. The inclination portion 31a is inclined in such a way that the area of the lower surface of the phosphor plate 31 becomes smaller.

The undercut portion 31b is connected to the lower end of the inclination portion 31a and the lower surface of the phosphor plate 31. The undercut portion 31b has a shape that is obtained by cutting out the outer peripheral end surface of the phosphor plate 31 in a substantially arc-shaped cross-section.

Material of the phosphor plate 31 is the same as that of the phosphor plate 13.

The phosphor plate 31 is placed on each LED chip 12 via the bonding member 14 so that the undercut portion 31b is opposed to the upper surface of each LED chip 12.

Further, the surface of the phosphor plate 31 is the light emitting surface 30a of the light emitting device 30.

[3-B] The bonding member 14 fixedly bonds the upper surface of each LED chip 12 to the lower surface of the phosphor plate 31.

The portion 14a of the bonding member 14 is sandwiched between the upper surface of each LED chip 12 and the lower surface of the phosphor plate 31 and is a flat thin film.

The portion 14b of the bonding member 14 covers the exposed portion 12a near the outer peripheral edge of the upper surface of each LED chip 12 and the undercut portion 31b of the phosphor plate 31. The exposed portion 12a is not covered by the phosphor plate 31 but exposed.

[3-C] The reflective layer 16 surrounds each LED chip 12 and the phosphor plate 31.

Further, the reflective layer 16 is filled into a space surrounded by the outer peripheral surface of each LED chip 12, the inclination portion 31a of the phosphor plate 31, the outer peripheral surface of the portion 14b of the bonding member 14, the surface of the insulation board 11 exposed from each LED chip 12 and the inner peripheral wall surface of the frame 15. The reflective layer 16 is injected to the inside of the frame 15 so that the reflective layer seals each LED chip 12, the phosphor plate 31 and the bonding member 14 and is filled into the gap S of each LED chip 12.

[Manufacturing Method of Third Embodiment]

First process (see FIG. 9 (A)): A plate material P of transparent material containing fine particles of the phosphor is cut using a dicing blade Db of a dicing apparatus to form grooves U with a substantially U-shaped cross-section in a square shape (not shown) on the surface of the plate material P.

Here, the cross-section shape of the dicing blade Db corresponds to the shape of the undercut portion 31b of the phosphor plate 31.

Second process (see FIGS. 9B and 9C): The phosphor plate 31 is produced from the plate material P by cutting out the plate material P using a dicing blade Da of the dicing apparatus to form grooves with a substantially V-shaped cross-section in the groove U of the plate material P and then cutting and separating the plate material P.

Here, the cross-section shape of the dicing blade Da corresponds to the shape of the inclination portion 31a of the phosphor plate 31.

Third process (see FIG. 9D): Each LED chip 12 is bonded to wiring layers formed on the surface of the insulation board 11.

Then, liquid adhesive for forming the bonding member 14 is applied only on the upper surface of each LED chip 12 using a dispenser or a screen printing device.

Subsequently, the phosphor plate 31 is placed so as to face the upper side of each LED chip 12 using a chip mounter.

Fourth process (see FIG. 9E): Load is applied to perform pressing by pushing the lower surface of the phosphor plate 31 against the upper surface of each LED chip 12 using a chip mounter.

Next, the members pressed are accommodated in a thermostatic bath and processed by heating, so that the bonding member 14 is thermally cured. In this way, each LED chip 12 and the phosphor plate 31 are fixedly bonded to each other via the bonding member 14.

Then, the film thickness of the portion 14a of the bonding member 14 sandwiched between each LED chip 12 and the phosphor plate 31 becomes uniform.

At the same time, the adhesive stuck out from between each LED chip 12 and the phosphor plate 31 forms the portion 14b of the bonding member 14 by the surface tension thereof.

Here, the adhesive stuck out from between each LED chip 12 and the phosphor plate 31 covers only the undercut portion 31b of the phosphor plate 31. The inclination portion 31a of the phosphor plate 31 is not covered by the bonding member 14 but exposed.

Fifth process (see FIG. 7 and FIG. 8): A liquid material for forming the reflective layer 16 is injected into a space surrounded by the outer peripheral surface of each LED chip 12, the inclination portion 31a of the phosphor plate 31, the outer peripheral surface of the portion 14b of the bonding member 14, the surface of the insulation board 11 exposed from each LED chip 12 and the inner peripheral wall surface of the frame 15. Then, the reflective layer 16 is cured.

In this way, the reflective layer 16 cured functions as adhesive so that each LED chip 12 and the phosphor plate 31, the insulation board 11 and the frame 15 are fixedly bonded via the reflective layer 16.

[Operation/Effect of Third Embodiment]

According to the light emitting device 30 of the third embodiment, the following operation/effect can be obtained

[3-1] In the light emitting device 30, the inclination portion 31a (portion near the upper surface of the phosphor plate 31) of the outer peripheral end surface of the phosphor plate 31 is not covered by the bonding member 14.

Specifically, upon fixedly bonding the upper surface of the LED chip 12 to the lower surface of the phosphor plate 31 by the bonding member 14, there is no possibility that the bonding member 14 stuck out covers the whole outer peripheral end surface of the phosphor plate 31 even when the bonding member 14 sticks out from between the LED chip 12 and the phosphor plate 31.

Therefore, according to the third embodiment, it can be prevented that the primary light of the LED chip 12 is transmitted through the bonding member 14 and leaks to the outside of the light emitting device 30. As a result, it is possible to provide the light emitting device 30 where the light emission quality is high.

Further, in the light emitting device 30, the undercut portion 31b (portion other than the vicinity of the upper surface of the phosphor plate 31) of the outer peripheral end surface of the phosphor plate 31 is covered by the bonding member 14 and the outer peripheral end surface of the phosphor plate 31 is fixedly bonded to the LED chip 12 via the bonding member 14 covering the undercut portion 31b. Accordingly, it is possible to achieve a stronger bonding fixation, as compared to a case where only the upper surface of the LED chip 12 and the lower surface of the phosphor plate 31 are fixedly bonded to each other.

Further, in the light emitting device 30, the exposed portion 12a of the upper surface of the LED chip 12, which is not covered by the phosphor plate 31, is covered by the reflective layer 16 via the bonding member 14, instead of being directly covered by the reflective layer 16.

Therefore, the light emitted from the exposed portion 12a of the LED chip 12 is transmitted through the portion 14b of the bonding member 14 covering the exposed portion 12a, reflected at the reflective layer 16 and then directed to the phosphor plate 31. In this way, the light is emitted to the outside from the phosphor plate 31, so that it is possible to improve the light extraction effect of the light emitting device 30.

[3-2] The undercut portion 31b is formed at the outer peripheral end surface of the phosphor plate 31 and has a shape that is obtained by cutting out the lower surface of the phosphor plate 31.

The bonding member 14 includes the portion 14a sandwiched between the upper surface of the LED chip 12 and the lower surface of the phosphor plate 31, and the portion 14b covering the exposed portion 12a of the LED chip 12 and the undercut portion 31b of the phosphor plate 31.

In the light emitting device 30, the bonding member 14 stuck out from between the LED chip 12 and the phosphor plate 31 forms the portion 14b covering the exposed portion 12a of the LED chip 12 and the undercut portion 31b of the phosphor plate 31 by the surface tension thereof. The bonding member 14 stuck out covers only the undercut portion 31b. The inclination portion 31a of the phosphor plate 31 is not covered by the bonding member 14. Accordingly, it is possible to reliably prevent the whole outer peripheral end surface of the phosphor plate 31 from being covered by the bonding member 14 stuck out.

Further, in the light emitting device 30, the bonding member 14 includes the portion 14b covering the exposed portion 12a of the LED chip 12 and the undercut portion 31b of the phosphor plate 31. Accordingly, the outer peripheral end surface of the phosphor plate 31 is fixedly bonded to the LED chip 12 via the portion 14b of the bonding member 14. As a result, it is possible to reliably bond and fix the outer peripheral end surface of the phosphor plate 31 to the LED chip 12, as compared to a case where only the portion 14a of the bonding member 14 is provided.

Furthermore, in the light emitting device 30, the light emitted from the exposed portion 12a of the LED chip 12 is transmitted through the portion 14b of the bonding member 14, reflected at the reflective layer 16 and then directed to the phosphor plate 31. In this way, the light is emitted to the outside from the phosphor plate 31, so that it is possible to reliably improve the light extraction effect.

[3-3] The undercut portion 31b of the phosphor plate 31 is formed only at the portion near the lower surface of the outer peripheral end surface of the phosphor plate 31.

Therefore, in the light emitting device 30, the bonding member 14 stuck out from between the LED chip 12 and the phosphor plate 31 covers only the undercut portion 31b of the phosphor plate 31. Accordingly, it can be reliably prevented that the inclination portion 31a (portion near the upper surface of the outer peripheral end surface of the phosphor plate 31) of the phosphor plate 31 is covered by the bonding member 14 stuck out. As a result, it is possible to reliably obtain the operation/effect of the [3-2].

Fourth Embodiment

Figure 10A:
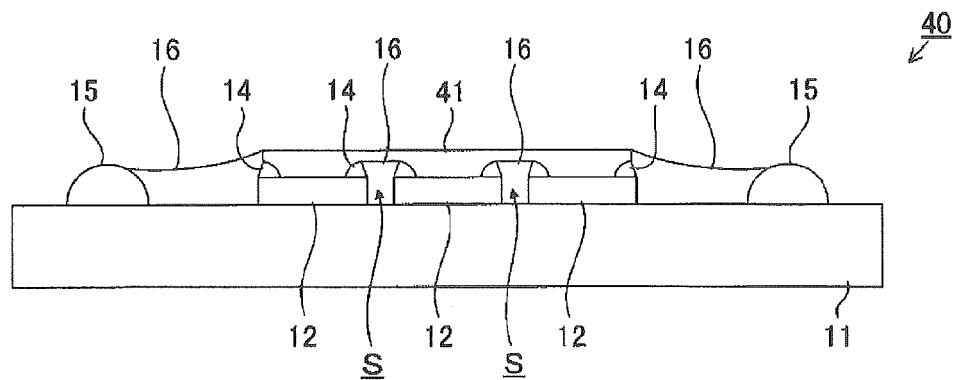
FIG. 10A is a longitudinal sectional view taken along an arrow X-X in FIG. 10B, showing a schematic configuration of a light emitting device 40 according to a fourth embodiment of the present invention
Figure 10B:
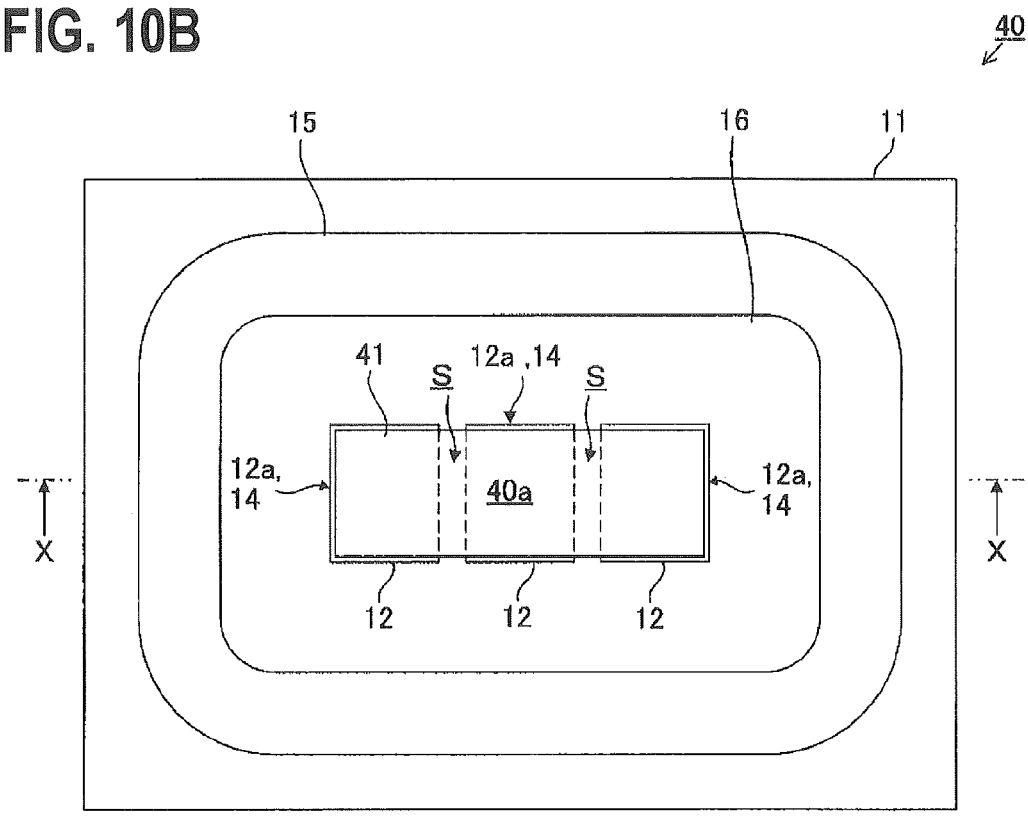
FIG. 10B is a plan view of the light emitting device 40.
Figure 12A:
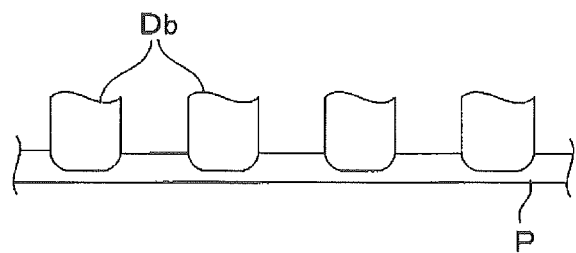
FIGS. 12A to 12D are longitudinal sectional views for explaining a manufacturing method of the light emitting device 40.
Figure 12B:
Figure 12C:
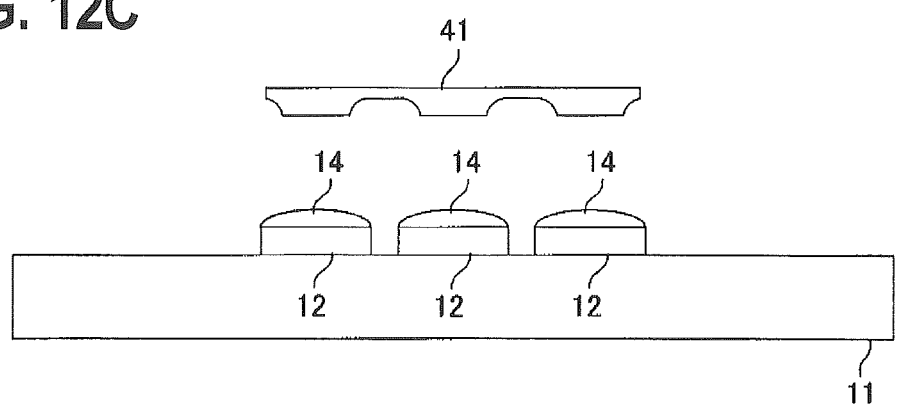
Figure 12D:
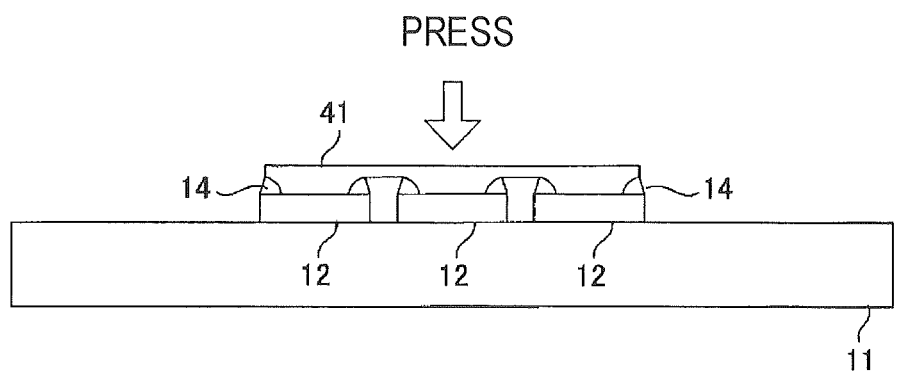

As shown in FIG. 10 and FIG. 11, a light emitting device 40 of a fourth embodiment includes the insulation board 11, the LED chip 12 (the exposed portion 12a), a phosphor plate 41 (a vertical portion 41a, an undercut portion 41b and a recessed portion 41c), the bonding member 14 (portions 14a to 14c), the frame 15, the reflective layer 16 and a light emitting surface 40a.

The light emitting device 40 of the fourth embodiment is different from the light emitting device 10 of the first embodiment only in the following points.

[4-A] Three phosphor plates 13 in the first embodiment are substituted with one phosphor plate 41 in the fourth embodiment.

The phosphor plate 41 has a substantially rectangular flat shape that is slightly smaller than the sum of the dimension of the upper surfaces of three LED chips 12 arranged and the gaps S between respective LED chips 12, as seen in a plan view.

The vertical portion 41a and the undercut portion 41b are formed at the outer peripheral end surface of the phosphor plate 41.

Two recessed portions 41c are formed at the lower surface of the phosphor plate 41.

The vertical portion 41a is vertically connected to the upper surface of the phosphor plate 41.

The undercut portion 41b is connected to the lower end of the vertical portion 41a and the lower surface of the phosphor plate 41. The undercut portion 41b has a shape that is obtained by cutting out the outer peripheral end surface of the phosphor plate 41 in a substantially arc-shaped cross-section.

Two recessed portions 41c have a linear groove shape with a substantially U-shaped cross-section and are formed in parallel to the lower surface of the phosphor plate 41.

Material of the phosphor plate 41 is the same as that of the phosphor plate 13.

The phosphor plate 41 is placed on each LED chip 12 via the bonding member 14 so that the undercut portion 41b and the recessed portions 41c are opposed to the upper surface of each LED chip 12.

Two recessed portions 41c of the phosphor plate 41 are, respectively, formed so as to cover the gap S of each LED chip 12.

Further, the surface of the phosphor plate 41 is the light emitting surface 40a of the light emitting device 40.

[4-B] The bonding member 14 fixedly bonds the upper surface of each LED chip 12 to the lower surface of the phosphor plate 41 and includes the portions 14a to 14c.

The portion 14a is sandwiched between the upper surface of each LED chip 12 and the lower surface of the phosphor plate 41 and is a flat thin film.

The portion 14b covers the exposed portion 12a near the outer peripheral edge of the upper surface of each LED chip 12 and the undercut portion 41b of the phosphor plate 41. The exposed portion 12a is not covered by the phosphor plate 41 but exposed.

The portion 14c covers the portion near the outer peripheral edge of the upper surface of each LED chip 12, which is covered by the recessed portion 41c of the phosphor plate 41, and a portion of an inner wall surface of the recessed portion 41c. The outer peripheral surface of the portion 14c has a shape that spreads in a skirt manner toward the upper surface of each LED chip 12.

[4-C] The reflective layer 16 surrounds each LED chip 12 and the phosphor plate 41.

Further, the reflective layer 16 is filled into a space surrounded by the outer peripheral surface of each LED chip 12, the vertical portion 41a of the phosphor plate 41, the outer peripheral surfaces of the portions 14b, 14c of the bonding member 14, the surface of the insulation board 11 exposed from each LED chip 12 and the inner peripheral wall surface of the frame 15. The reflective layer 16 is injected to the inside of the frame 15 so that the reflective layer seals each LED chip 12, the phosphor plate 41 and the bonding member 14 and is filled into the gap S of each LED chip 12.

[Manufacturing Method of Fourth Embodiment]

First process (see FIG. 12 (A)): The phosphor plate 41 is produced from a plate material P by cutting out the plate material P of transparent material containing fine particles of the phosphor using a dicing blade Db of a dicing apparatus to form grooves with a substantially U-shaped cross-section in parallel and then cutting and separating the plate material P.

Here, the cross-section shape of the dicing blade Db corresponds to the shapes of the undercut portion 41b and the recessed portion 41c of the phosphor plate 41.

Second process (see FIG. 12C): Each LED chip 12 is bonded to wiring layers formed on the surface of the insulation board 11.

Then, liquid adhesive for forming the bonding member 14 is applied only on the upper surface of each LED chip 12 using a dispenser or a screen printing device.

Subsequently, the phosphor plate 41 is placed so as to face the upper side of each LED chip 12 using a chip mounter.

Third process (see FIG. 12D): Load is applied to perform pressing by pushing the lower surface of the phosphor plate 41 against the upper surface of each LED chip 12 using a chip mounter.

Next, the members pressed are accommodated in a thermostatic bath and processed by heating, so that the bonding member 14 is thermally cured. In this way, each LED chip 12 and the phosphor plate 41 are fixedly bonded to each other via the bonding member 14.

Then, the film thickness of the portion 14a of the bonding member 14 sandwiched between each LED chip 12 and the phosphor plate 41 becomes uniform.

At the same time, the adhesive stuck out from between each LED chip 12 and the phosphor plate 41 forms the portions 14b, 14c of the bonding member 14 by the surface tension thereof.

Here, the adhesive stuck out from between each LED chip 12 and the phosphor plate 41 covers only the undercut portion 41b and the recessed portion 41c of the phosphor plate 41. The vertical portion 41a of the phosphor plate 41 is not covered by the bonding member 14 but exposed.

Fourth process (see FIG. 10 and FIG. 11): A liquid material for forming the reflective layer 16 is injected into a space surrounded by the outer peripheral surface of each LED chip 12, the vertical portion 41a of the phosphor plate 41, the outer peripheral surfaces of the portions 14b, 14c of the bonding member 14, the surface of the insulation board 11 exposed from each LED chip 12 and the inner peripheral wall surface of the frame 15. Then, the reflective layer 16 is cured.

In this way, the reflective layer 16 cured functions as adhesive so that each LED chip, 12 and the phosphor plate 41, the insulation board 11 and the frame 15 are fixedly bonded via the reflective layer 16.

[Operation/Effect of Fourth Embodiment]

According to the light emitting device 40 of the fourth embodiment, it is possible to obtain the same operation/effect as the [1-1] to [1-3] in the light emitting device 10 of the first embodiment.

The light emitting device 40 includes three LED chips 12 arranged with gaps S therebetween and only one phosphor plate 41 is provided for three LED chips 12.

At the lower surface of the phosphor plate 41, the recessed portions 41c are formed so as to cover the gaps S.

The bonding member 14 includes the portion 14a sandwiched between the upper surface of the LED chip 12 and the lower surface of the phosphor plate 41 and the portion 14c covering a portion of the recessed portions 41c of the phosphor plate 41 and the exposed portion 12a of the LED chip 12.

In the light emitting device 40, the bonding member 14 stuck out from between the LED chip 12 and the phosphor plate 41 forms the portion 14c covering a portion of the recessed portions 41c of the phosphor plate 41 and the exposed portion 12a of the LED chip 12 by the surface tension thereof. Accordingly, it is possible to reliably prevent the whole outer peripheral end surface of the phosphor plate 41 from being covered by the bonding member 14 stuck out.

Further, in the light emitting device 40, the bonding member 14 includes the portion 14c and therefore the outer peripheral end surface of the phosphor plate 41 is fixedly bonded to the LED chip 12 via the portion 14c of the bonding member 14. Accordingly, it is possible to reliably bond and fix the outer peripheral end surface of the phosphor plate 41 to the LED chip 12.

Fifth Embodiment

Figure 13A:
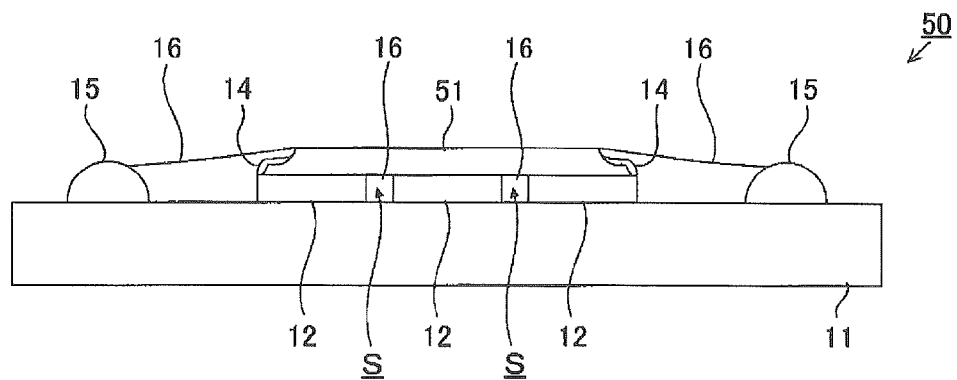
FIG. 13A is a longitudinal sectional view taken along an arrow X-X in FIG. 13B, showing a schematic configuration of a light emitting device 50 according to a fifth embodiment of the present invention
Figure 13B:
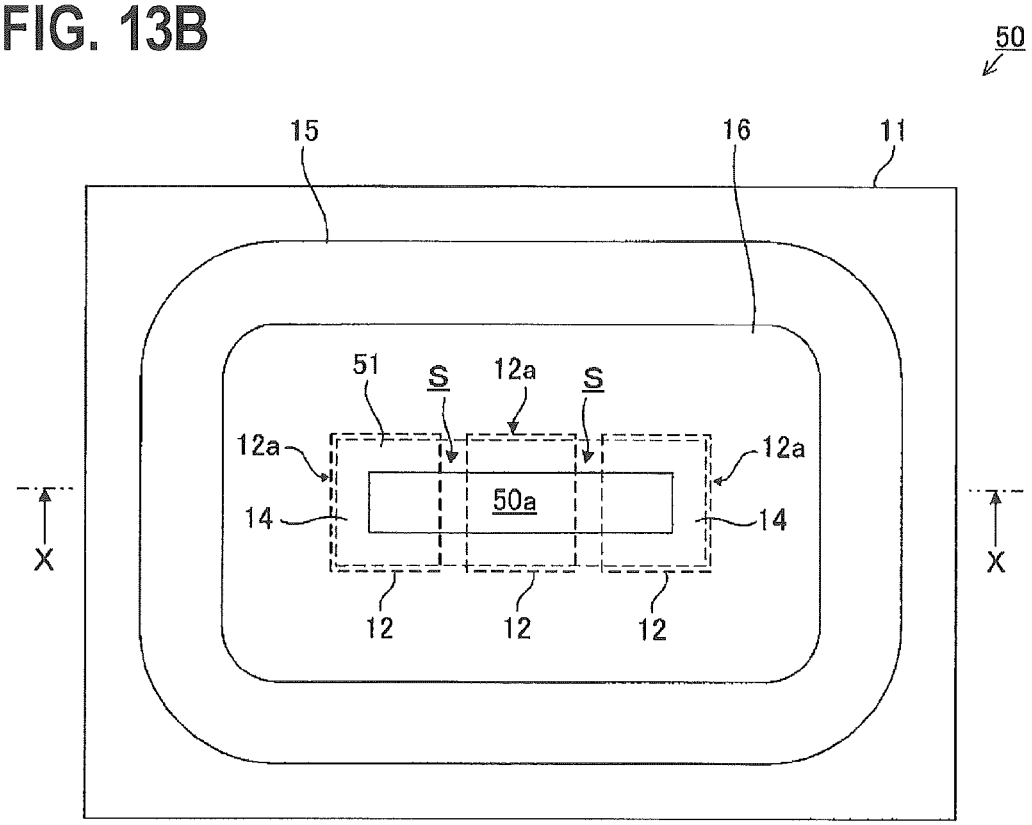
FIG. 13B is a plan view of the light emitting device 50.
Figure 14:
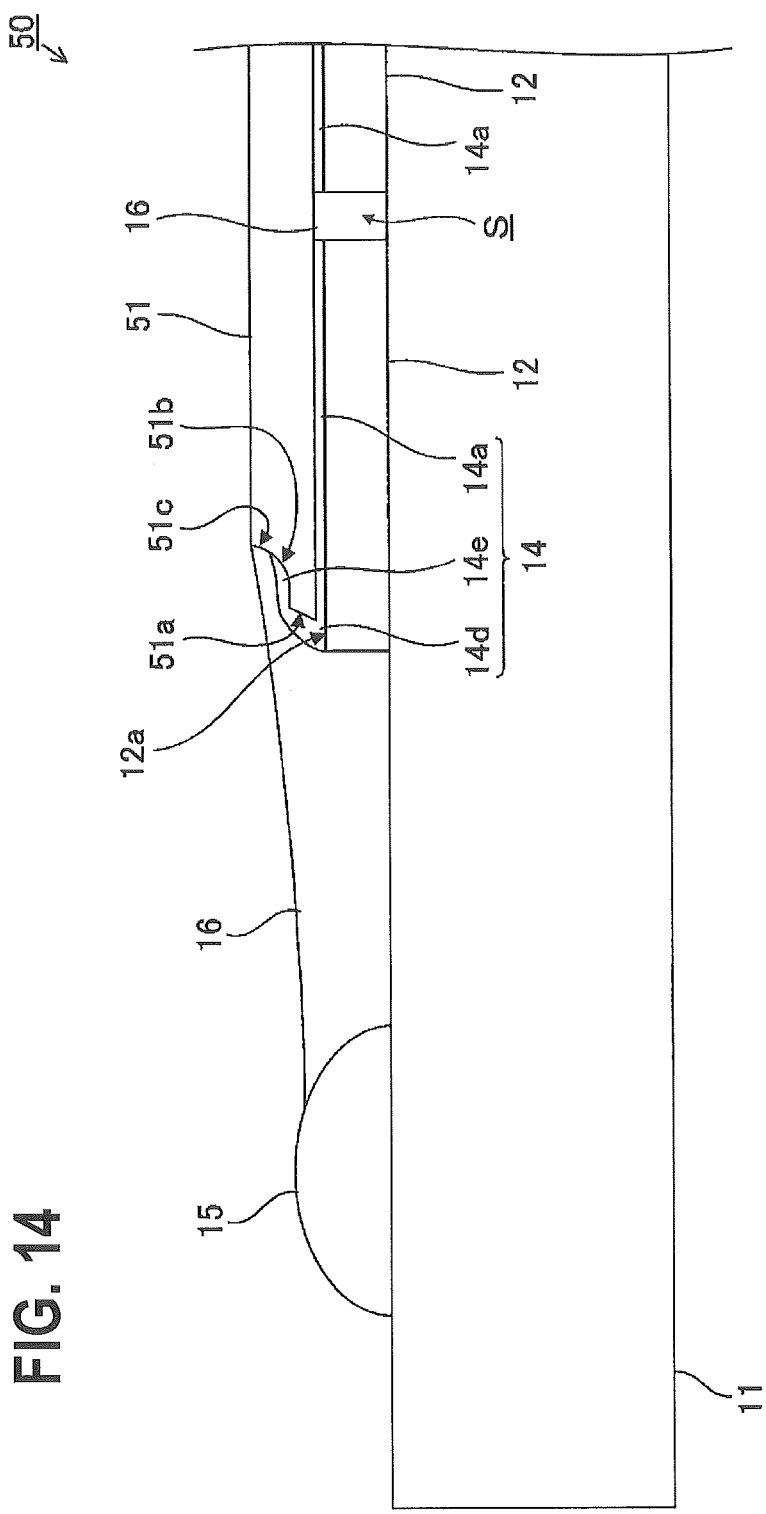
FIG. 14 is an enlarged longitudinal sectional view showing a main part (left part in FIG. 13A) of the light emitting device 50.

As shown in FIG. 13 and FIG. 14, a light emitting device 50 of a fifth embodiment includes the insulation board 11, the LED chip 12 (the exposed portion 12a), a phosphor plate 51 (an inclination portion 51a, an uppercut portion 51b and a top portion 51c of the uppercut portion 51b), the bonding member 14 (portions 14a, 14d and 14e), the frame 15, the reflective layer 16 and a light emitting surface 50a.

The light emitting device 50 of the fifth embodiment is different from the light emitting device 10 of the first embodiment only in the following points.

[5-A] Three phosphor plates 13 in the first embodiment are substituted with one phosphor plate 51 in the fifth embodiment.

The phosphor plate 51 has a substantially rectangular flat shape that is slightly smaller than the sum of the dimension of the upper surfaces of three LED chips 12 arranged and the gaps S between respective LED chips 12, as seen in a plan view. The inclination portion 51a and the uppercut portion 51b are formed at the outer peripheral end surface of the phosphor plate 51.

The inclination portion 51a is connected to the lower surface of the phosphor plate 51 at an acute angle. The inclination portion 51a is inclined in such a way that the area of the upper surface of the phosphor plate 51 becomes smaller.

The uppercut portion 51b is connected to the upper end of the inclination portion 51a and the upper surface of the phosphor plate 51. The uppercut portion 51b has a shape that is obtained by cutting out the outer peripheral end surface of the phosphor plate 51 in a substantially arc-shaped cross-section.

Material of the phosphor plate 51 is the same as that of the phosphor plate 13.

The phosphor plate 51 is placed on each LED chip 12 via the bonding member 14 so that the lower surface thereof is opposed to the upper surface of each LED chip 12.

Further, the surface of the phosphor plate 51 is the light emitting surface 50a of the light emitting device 50.

Namely, the phosphor plate 51 of the fifth embodiment corresponds to one obtained by turning over the phosphor plate 31 of the third embodiment.

[5-B] The bonding member 14 fixedly bonds the upper surface of each LED chip 12 to the lower surface of the phosphor plate 51 and includes the portions 14a, 14d and 14e.

The portion 14a is sandwiched between the upper surface of each LED chip 12 and the lower surface of the phosphor plate 51 and is a flat thin film.

The portion 14d covers the exposed portion 12a near the outer peripheral edge of the upper surface of each LED chip 12 and the inclination portion 51a of the phosphor plate 51. The exposed portion 12a is not covered by the phosphor plate 51 but exposed.

The portion 14e covers only the lower side of the uppercut portion 51b of the phosphor plate 51.

[5-C] The reflective layer 16 surrounds each LED chip 12 and the phosphor plate 51.

Further, the reflective layer 16 is filled into a space surrounded by the outer peripheral surface of each LED chip 12, the top portion 51c of the uppercut portion 51b of the phosphor plate 51, the outer peripheral surfaces of the portions 14d, 14e of the bonding member 14, the surface of the insulation board 11 exposed from each LED chip 12 and the inner peripheral wall surface of the frame 15. The reflective layer 16 is injected to the inside of the frame 15 so that the reflective layer seals each LED chip 12, the phosphor plate 51 and the bonding member 14 and is filled into the gap S of each LED chip 12.

[Manufacturing Method of Fifth Embodiment]

Figure 15A:
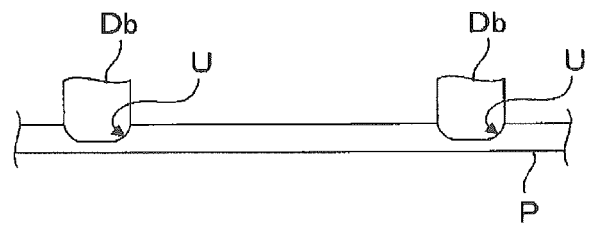
FIGS. 15A to 15E are longitudinal sectional views for explaining a manufacturing method of the light emitting device 50.

First process (see FIG. 15(A)): The first process is the same as the first process of the third embodiment.

Here, the cross-section shape of the dicing blade Db corresponds to the shape of the uppercut portion 51b of the phosphor plate 51.

Figure 15B:
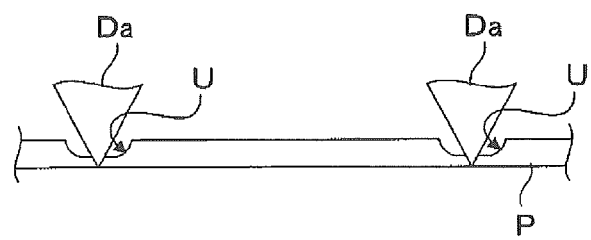
Figure 15C:
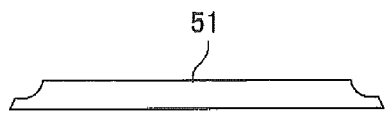

Second process (see FIGS. 15B and 15C): The second process is the same as the second process of the third embodiment. The phosphor plate 51 is produced from the plate material P of transparent material.

Here, the cross-section shape of the dicing blade Da corresponds to the shape of the inclination portion 51a of the phosphor plate 51.

Figure 15D:
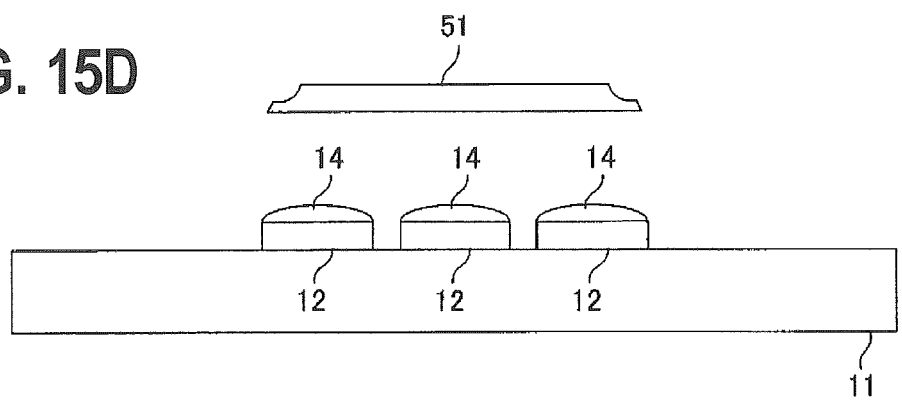

Third process (see FIG. 15D): Each LED chip 12 is bonded to wiring layers formed on the surface of the insulation board 11.

Then, liquid adhesive for forming the bonding member 14 is applied only on the upper surface of each LED chip 12 using a dispenser or a screen printing device.

Subsequently, the phosphor plate 51 is placed so as to face the upper side of each LED chip 12 using a chip mounter.

Figure 15E:
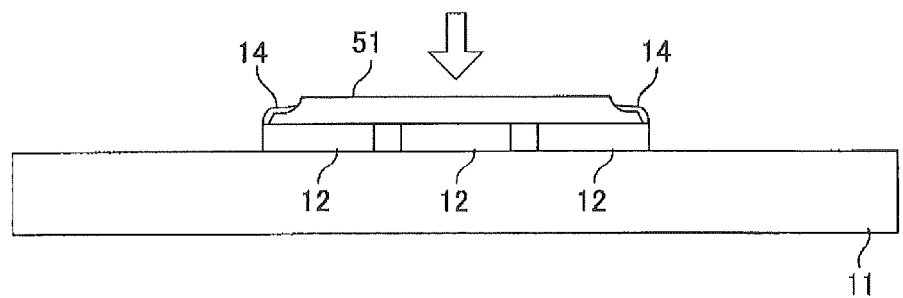

Fourth process (see FIG. 15E): Load is applied to perform pressing by pushing the lower surface of the phosphor plate 51 against the upper surface of each LED chip 12 using a chip mounter.

Next, the members pressed are accommodated in a thermostatic bath and processed by heating, so that the bonding member 14 is thermally cured. In this way, each LED chip 12 and the phosphor plate 51 are fixedly bonded to each other via the bonding member 14.

Then, the film thickness of the portion 14a of the bonding member 14 sandwiched between each LED chip 12 and the phosphor plate 51 becomes uniform.

At the same time, the adhesive stuck out from between each LED chip 12 and the phosphor plate 51 forms the portions 14d, 14e of the bonding member 14 by the surface tension thereof.

Here, the adhesive stuck out from between each LED chip 12 and the phosphor plate 51 covers only the lower side of the uppercut portion 51b of the phosphor plate 51. The inner wall surface of the top portion 51c of the uppercut portion 51b is not covered by the bonding member 14 but exposed.

Fifth process (see FIG. 13 and FIG. 14): A liquid material for forming the reflective layer 16 is injected into a space surrounded by the outer peripheral surface of each LED chip 12, the top portion 51c of the uppercut portion 51b of the phosphor plate 51, the outer peripheral surfaces of the portions 14d, 14e of the bonding member 14, the surface of the insulation board 11 exposed from each LED chip 12 and the inner peripheral wall surface of the frame 15. Then, the reflective layer 16 is cured.

In this way, the reflective layer 16 cured functions as adhesive so that each LED chip 12 and the phosphor plate 51, the insulation board 11 and the frame 15 are fixedly bonded via the reflective layer 16.

[Operation/Effect of Fourth Embodiment]

According to the light emitting device 50 of the fifth embodiment, the following operation/effect can be achieved.

[5-1] In the light emitting device 50, the uppercut portion 51b is formed at the outer peripheral end surface of the phosphor plate 51. The uppercut portion 51b has a shape that is obtained by cutting out the upper side of the phosphor plate 51. The top portion 51c (portion near the upper surface of the phosphor plate 51) of the uppercut portion 51b is not covered by the bonding member 14.

Specifically, upon fixedly bonding the upper surface of the LED chip 12 to the lower surface of the phosphor plate 51 by the bonding member 14, there is no possibility that the bonding member 14 stuck out covers the whole outer peripheral end surface of the phosphor plate 51 even when the bonding member 14 sticks out from between the LED chip 12 and the phosphor plate 51.

Therefore, according to the fifth embodiment, it can be prevented that the primary light of the LED chip 12 is transmitted through the bonding member 14 and leaks to the outside of the light emitting device 50. As a result, it is possible to provide the light emitting device 50 where the light emission quality is high.

Further, in the light emitting device 50, the lower sides (portion other than the vicinity of the upper surface of the phosphor plate 51) of the inclination portion 51a and the uppercut portion 51b of the outer peripheral end surface of the phosphor plate 51 are covered by the bonding member 14 and the outer peripheral end surface of the phosphor plate 51 is fixedly bonded to the LED chip 12 via the bonding member 14 covering the lower sides of the inclination portion 51a and the uppercut portion 51b. Accordingly, it is possible to achieve a stronger bonding fixation, as compared to a case where only the upper surface of the LED chip 12 and the lower surface of the phosphor plate 51 are fixedly bonded to each other.

Further, in the light emitting device 50, the exposed portion 12a of the upper surface of the LED chip 12, which is not covered by the phosphor plate 51, is covered by the reflective layer 16 via the bonding member, instead of being directly covered by the reflective layer 16.

Therefore, the light emitted from the exposed portion 12a of the LED chip 12 is transmitted through the portions 14d, 14e of the bonding member 14 covering the exposed portion 12a, reflected at the reflective layer 16 and then directed to the phosphor plate 51. In this way, the light is emitted to the outside from the phosphor plate 51, so that it is possible to improve the light extraction effect of the light emitting device 50.

[5-2] The bonding member 14 includes the portion 14a sandwiched between the upper surface of the LED chip 12 and the lower surface of the phosphor plate 51, the portion 14d covering the exposed portion 12a of the LED chip 12 and the inclination portion 51b of the phosphor plate 51 and the portion 14e covering the lower side of the uppercut portion 51b of the phosphor plate 51.

In the light emitting device 50, the bonding member 14 stuck out from between the LED chip 12 and the phosphor plate 51 forms the portions 14d, 14e by the surface tension thereof. The bonding member 14 stuck out covers only the lower side of the uppercut portion 51b. Accordingly, it is possible to reliably prevent the whole outer peripheral end surface of the phosphor plate 51 from being covered by the bonding member 14 stuck out.

Further, in the light emitting device 50, the bonding member 14 includes the portions 14d, 14e and therefore, the outer peripheral end surface of the phosphor plate 51 is fixedly bonded to the LED chip 12 via the portions 14d, 14e of the bonding member 14. Accordingly, it is possible to reliably bond and fix the outer peripheral end surface of the phosphor plate 51 to the LED chip 12.

Furthermore, in the light emitting device 50, the light emitted from the exposed portion 12a of the LED chip 12 is transmitted through the portion 14d of the bonding member 14, reflected at the reflective layer 16 and then directed to the phosphor plate 51. In this way, the light is emitted to the outside from the phosphor plate 51, so that it is possible to reliably improve the light extraction effect of the light emitting device 50.

[5-3] The uppercut portion 51b of the phosphor plate 51 is formed only at the portion of the outer peripheral end surface of the phosphor plate 51, which is located near the upper surface of the phosphor plate 51.

Therefore, in the light emitting device 50, the bonding member 14 stuck out from between the LED chip 12 and the phosphor plate 51 covers only the lower side of the uppercut portion 51b. Accordingly, it can be reliably prevented that the top portion 51c (portion near the upper surface of the outer peripheral end surface of the phosphor plate 51) of the uppercut portion 51b is covered by the bonding member 14 stuck out. As a result, it is possible to reliably obtain the operation/effect of the [5-2].

Sixth Embodiment

Figure 16:
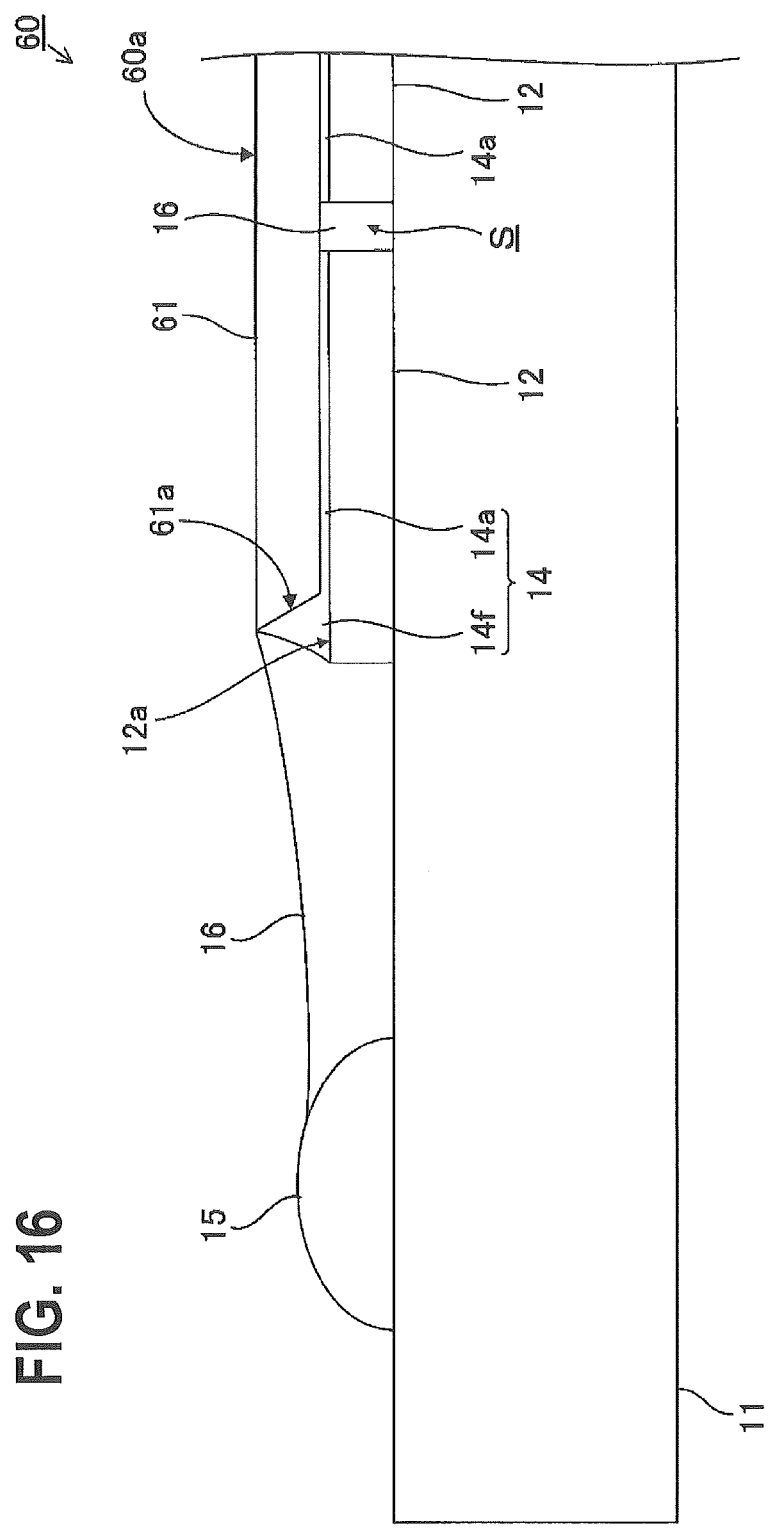
FIG. 16 is an enlarged longitudinal sectional view showing a main part of a light emitting device 60 according to a sixth embodiment of the present invention.

As shown in FIG. 16, a light emitting device 60 of a sixth embodiment includes the insulation board 11, the LED chip 12 (the exposed portion 12a), a phosphor plate 61 (an inclination portion 61a), the bonding member 14 (portions 14a, 14f), the frame 15, the reflective layer 16 and a light emitting surface 60a.

The light emitting device 60 of the sixth embodiment is different from the light emitting device 20 of the second embodiment only in the following points.

[6-A] The phosphor plate 21 of the second embodiment is substituted with the phosphor plate 61 of the sixth embodiment.

The phosphor plate 61 has a substantially rectangular flat shape that is slightly smaller than the sum of the dimension of the upper surfaces of three LED chips 12 arranged and the gaps S between respective LED chips 12, as seen in a plan view. The inclination portion 61a is formed at the outer peripheral end surface of the phosphor plate 61.

The inclination portion 61a is connected to the upper surface of the phosphor plate 61 at an acute angle and connected to the lower surface of the phosphor plate 61 at an obtuse angle. The inclination portion 61a is inclined in such a way that the area of the lower surface of the phosphor plate 61 becomes smaller.

Material of the phosphor plate 61 is the same as that of the phosphor plate 21.

The phosphor plate 61 is placed on each LED chip 12 via the bonding member 14 so that the inclination portion 61a is opposed to the upper surface of each LED chip 12.

Namely, the phosphor plate 61 is different from the phosphor plate 21 only in that the vertical portion 21a is omitted.

[6-B] The bonding member 14 fixedly bonds the upper surface of each LED chip 12 to the lower surface of the phosphor plate 61 and includes the portions 14a, 14f.

The portion 14a is sandwiched between the upper surface of each LED chip 12 and the lower surface of the phosphor plate 61 and is a flat thin film.

The portion 14f covers the exposed portion 12a near the outer peripheral edge of the upper surface of each LED chip 12 and the inclination portion 61a of the phosphor plate 61, thereby covering the whole outer peripheral end surface of the phosphor plate 61. The exposed portion 12a is not covered by the phosphor plate 61 but exposed. The outer peripheral surface of the portion 14f has a shape that spreads in a skirt manner toward the upper surface of each LED chip 12.

[6-C] The reflective layer 16 surrounds each LED chip 12 and the phosphor plate 61.

Further, the reflective layer 16 is filled into a space surrounded by the outer peripheral surface of each LED chip 12, the outer peripheral, surface of the portion 14f of the bonding member 14, the surface of the insulation board 11 exposed from each LED chip 12 and the inner peripheral wall surface of the frame 15. The reflective layer 16 is injected to the inside of the frame 15 so that the reflective layer seals each LED chip 12, the phosphor plate 61 and the bonding member 14 and is filled into the gap S of each LED chip 12.

In the sixth embodiment, the phosphor plate 61 is formed with the inclination portion 61a. Accordingly, it is possible to minimally suppress the primary light of the LED chip 12 from leaking to the outside of the light emitting device 60 although the whole outer peripheral end surface of the phosphor plate 61 is covered by the portion 14f of the bonding member 14. As a result, it is possible to obtain substantially the same the operation/effect as the light emitting device 20 of the second embodiment.

Seventh Embodiment

Figure 17:
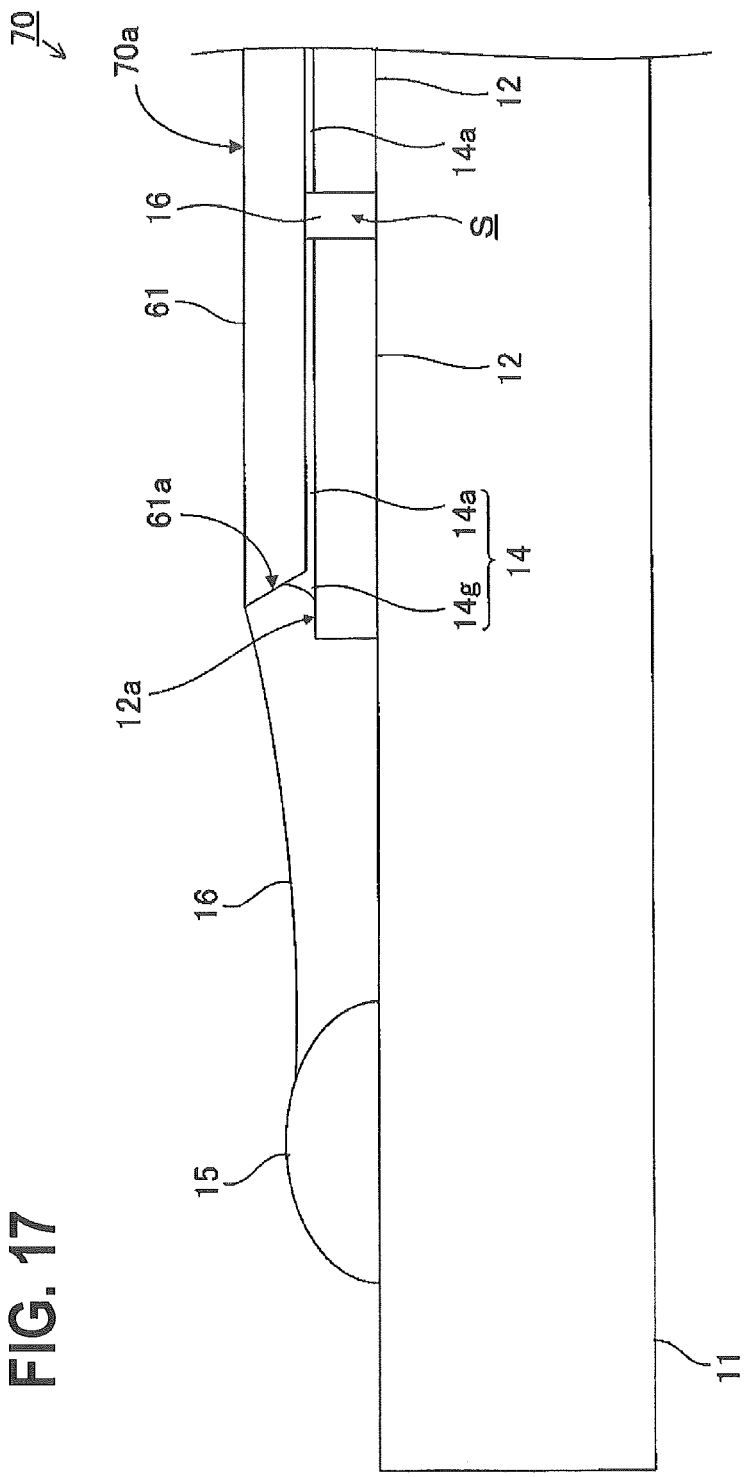
FIG. 17 is an enlarged longitudinal sectional view showing a main part of a light emitting device 70 according to a seventh embodiment of the present invention.

As shown in FIG. 17, a light emitting device 70 of a seventh embodiment includes the insulation board 11, the LED chip 12 (the exposed portion 12a), the phosphor plate 61 (the inclination portion 61a), the bonding member 14 (portions 14a, 14f), the frame 15, the reflective layer 16 and a light emitting surface 70a.

The light emitting device 70 of the seventh embodiment is different from the light emitting device 60 of the sixth embodiment only in the following points.

[7-A] The bonding member 14 fixedly bonds the upper surface of each LED chip 12 to the lower surface of the phosphor plate 61 and includes the portions 14a, 14g.

The portion 14a is sandwiched between the upper surface of each LED chip 12 and the lower surface of the phosphor plate 61 and is a flat thin film.

The portion 14g covers the upper surface of each LED chip 12 and the lower side of the inclination portion 61a of the phosphor plate 61. The outer peripheral surface of the portion 14g has a shape that spreads in a skirt manner toward the upper surface of each LED chip 12.

[7-B] The reflective layer 16 surrounds each LED chip 12 and the phosphor plate 61.

Further, the reflective layer 16 is filled into a space surrounded by the outer peripheral surface of each LED chip 12, the upper side of the inclination portion 61a of the phosphor plate 61, the outer peripheral surface of the portion 14g of the bonding member 14, the exposed portion 12a near the outer peripheral edge of the upper surface of each LED chip 12, the surface of the insulation board 11 exposed from each LED chip 12 and the inner peripheral wall surface of the frame 15.

The exposed portion 12a is not covered by the phosphor plate 61 but exposed. The reflective layer 16 is injected to the inside of the frame 15 so that the reflective layer seals each LED chip 12, the phosphor plate 61 and the bonding member 14 and is filled into the gap S of each LED chip 12.

In the seventh embodiment, the phosphor plate 61 is formed with the inclination portion 61a, the portion 14g of the bonding member 14 covers only the lower side of the inclination portion 61a of the phosphor plate 61, and the upper portion (portion near the upper surface of the phosphor plate 61) of the inclination portion 61a of the phosphor plate 61 is not covered by the bonding member 14. Accordingly, it is possible to prevent the primary light of the LED chip 12 from leaking to the outside of the light emitting device 70.

Another Embodiment

The present invention is not limited to each of the above-described embodiments but may be embodied as follows. Also in these cases, it is possible to obtain the operation/effect equal to or better than each of the above-described embodiments.

(a) In the light emitting device 10 of the first embodiment, the light emitting device 20 of the second embodiment and the light emitting device 40 of the fourth embodiment, the vertical portions 13a, 21a, 41a of the phosphor plates 13, 21, 41 may be omitted. In this case, the operation/effect of the [1-3] cannot be obtained, but the other operation/effects can be similarly obtained.

Further, the vertical portions 13a, 21a, 41a of the phosphor plates 13, 21, 41 may be substituted with the inclination portions which is formed at a proper angle to the upper surfaces of the phosphor plates 13, 21, 41.

(b) The number of the LED chips 12 is not limited to three but may be set to a proper value. The LED chips 12 are not arranged in a row but may be arranged in plural rows. Alternatively, the LED chips 12 may be arranged side by side in an appropriate form (e.g., a grid form, etc).

In this case, the planar shapes of the frame 15 and the phosphor plates 13, 21, 31, 41, 51, 61 may be properly changed in accordance with the arrangement of the LED chips 12.

(c) The LED chip 12 may be substituted with any semiconductor light emitting element (e.g., organic EL chip, etc.)

(d) The frame 15 may be omitted and only the reflective layer 16 may be provided.

(e) Fine irregularities may be formed on the surface of the phosphor plates 13, 21, 31, 41, 51, 61.

In this case, since the light emitted from the surfaces of the phosphor plates is scattered by the fine irregularities of the surfaces of the phosphor plates 13, 21, 31, 41, 51, 61, it is possible to make the in-plane distribution of chromaticity uniform in the light emitting surfaces 10a, 20a, 30a, 40a, 50a, 60a, 70a of the light emitting devices 10, 20, 30, 40, 50, 60, 70. Accordingly, it is possible to suppress the occurrence of variations in chromaticity.

Further, in order to form the fine irregularities on the surface of the phosphor plate, various methods (e.g., pressing, sandblasting, etching, etc.) for processing a rough surface may be used.

(f) Fine particles of material (e.g., silica, titanium oxide, etc.) with high light-scattering properties may be contained in the phosphor plates 13, 21, 31, 41, 51, 61. In this case, since the phosphor plate has the light-scattering properties, it is possible to obtain the same operation/effect as the (e)

(g) Each of the above-described embodiments may be realized in a proper combination. In this case, the operation/effects of the embodiments combined can be additionally obtained or a synergy effect can be obtained.

The present invention is not limited to the description of respective embodiments and each of the aspects. The present invention also includes various modifications which can be easily conceived by those skilled in the art without departing from the description of the claims. The contents of publications mentioned in the present specification are incorporated by reference in its entity.

What is claimed is:

1. A light emitting device comprising:
a semiconductor light emitting element that is disposed on a surface of a board;
a transparent phosphor plate that includes phosphors;
a transparent bonding member that fixedly bonds an upper surface of the semiconductor light emitting element to a lower surface of the phosphor plate; and
a reflective layer that surrounds the semiconductor light emitting element and the phosphor plate and contains light-reflective fine particles,
wherein the semiconductor light emitting element includes an exposed portion that is provided near an outer peripheral edge of the upper surface of the semiconductor light emitting element and is not covered by the phosphor plate but exposed,
wherein a portion of an outer peripheral end surface of the phosphor plate, which is located near the upper surface of the phosphor plate, is not covered by the bonding member,
wherein the exposed portion is covered by the reflective layer via the bonding member,
wherein the phosphor plate includes an inclination portion that is formed at the outer peripheral end surface of the phosphor plate, the inclination portion being connected to the lower surface of the phosphor plate at an obtuse angle and inclined in such a way that the area of the lower surface of the phosphor plate becomes smaller, and
wherein the bonding member includes a portion sandwiched between the upper surface of the semiconductor light emitting element and the lower surface of the phosphor plate, and a portion covering the exposed portion and the inclination portion.

2. The light emitting device according to claim 1, wherein the inclination portion is formed only at the portion of the outer peripheral end surface of the phosphor plate, which is located near the lower surface of the phosphor plate.

3. The light emitting device according to claim 1, wherein an undercut portion is formed at the outer peripheral end surface of the phosphor plate and has a shape that is obtained by cutting out a lower side of the phosphor plate, and
the bonding member includes a portion sandwiched between the upper surface of the semiconductor light emitting element and the lower surface of the phosphor plate, and a portion covering the exposed portion and the undercut portion.

4. The light emitting device according to claim 3, wherein the undercut portion is formed only at the portion of the outer peripheral end surface of the phosphor plate, which is located near the lower surface of the phosphor plate.

5. The light emitting device according to claim 1, wherein an uppercut portion is formed at the outer peripheral end surface of the phosphor plate and has a shape that is obtained by cutting out an upper side of the phosphor plate, and
the bonding member includes a portion sandwiched between the upper surface of the semiconductor light emitting element and the lower surface of the phosphor plate, and a portion covering only the exposed portion and a lower side of the uppercut portion.

6. The light emitting device according to claim 5, wherein the uppercut portion is formed only at the portion of the outer peripheral end surface of the phosphor plate, which is located near the upper surface of the phosphor plate.

7. The light emitting device according to claim 1, wherein a plurality of semiconductor light emitting elements is arranged with gaps therebetween, and
the phosphor plate is separately provided for each of the plurality of the semiconductor light emitting elements.

8. The light emitting device according to claim 1, wherein a plurality of semiconductor light emitting elements is arranged with gaps therebetween,
only one phosphor plate is provided for the plurality of the semiconductor light emitting elements,
a recessed portion is formed at the lower surface of the phosphor plate and disposed so as to cover the gaps, and
the bonding member includes a portion sandwiched between the upper surfaces of the semiconductor light emitting elements and the lower surface of the phosphor plate, and a portion covering the exposed portion and a portion of the recessed portion.

9. The light emitting device according to claim 1, wherein a width of a top portion of the phosphor plate is less than a width of the semiconductor light emitting element.

10. The light emitting device according to claim 1, wherein the phosphor plate further includes a vertical portion that is vertically connected to the upper surface of the phosphor plate and connected to a point of the inclination portion nearest the upper surface of the phosphor plate.

11. A light emitting device comprising:
a semiconductor light emitting element that is disposed on a surface of a board;
a transparent phosphor plate that includes phosphors;
a transparent bonding member that fixedly bonds an upper surface of the semiconductor light emitting element to a lower surface of the phosphor plate; and
a reflective layer that surrounds the semiconductor light emitting element and the phosphor plate and contains light-reflective fine particles,
wherein the semiconductor light emitting element includes an exposed portion that is provided near an outer peripheral edge of the upper surface of the semiconductor light emitting element and is not covered by the phosphor plate but exposed,
wherein a portion of an outer peripheral end surface of the phosphor plate, which is located near the upper surface of the phosphor plate, is not covered by the bonding member,
wherein the exposed portion is covered by the reflective layer via the bonding member, and
wherein the phosphor plate includes an inclination portion that is formed at the outer peripheral end surface of the phosphor plate, the inclination portion being connected to the lower surface of the phosphor plate at an obtuse angle and inclined in such a way that the area of the lower surface of the phosphor plate becomes smaller.

12. The light emitting device according to claim 11, wherein the phosphor plate further includes a vertical portion that is vertically connected to the upper surface of the phosphor plate and connected to a point of the inclination portion nearest the upper surface of the phosphor plate.

13. The light emitting device according to claim 11, wherein the inclination portion is formed only at the portion of the outer peripheral end surface of the phosphor plate, which is located near the lower surface of the phosphor plate.

* * * * *